(12) United States Patent
Suzuki et al.

(10) Patent No.: US 12,362,199 B2
(45) Date of Patent: Jul. 15, 2025

(54) SUBSTRATE PROCESSING METHOD AND SUBSTRATE PROCESSING APPARATUS

(71) Applicant: SCREEN Holdings Co., Ltd., Kyoto (JP)

(72) Inventors: Kei Suzuki, Kyoto (JP); Masaki Inaba, Kyoto (JP)

(73) Assignee: SCREEN Holdings Co., Ltd., Kyoto (JP)

( * ) Notice: Subject to any disclaimer, the term of this patent is extended or adjusted under 35 U.S.C. 154(b) by 122 days.

(21) Appl. No.: 17/892,438

(22) Filed: Aug. 22, 2022

(65) Prior Publication Data

US 2023/0069633 A1 Mar. 2, 2023

(30) Foreign Application Priority Data

Aug. 31, 2021 (JP) ................................ 2021-141268

(51) Int. Cl.
*H01L 21/67* (2006.01)
*G03F 7/42* (2006.01)

(52) U.S. Cl.
CPC .......... *H01L 21/67023* (2013.01); *G03F 7/42* (2013.01); *H01L 21/67051* (2013.01); *H01L 21/67103* (2013.01)

(58) Field of Classification Search
None
See application file for complete search history.

(56) References Cited

U.S. PATENT DOCUMENTS

| | | | |
|---|---|---|---|
| 2002/0115025 A1 | 8/2002 | Noda et al. | 430/329 |
| 2003/0205240 A1 | 11/2003 | Bergman | 134/3 |
| 2004/0063319 A1* | 4/2004 | Toshima | H01L 21/67757 438/689 |
| 2004/0209194 A1 | 10/2004 | Kume et al. | 430/313 |
| 2007/0227556 A1* | 10/2007 | Bergman | G03F 7/423 134/28 |
| 2008/0083427 A1 | 4/2008 | Block et al. | 134/3 |
| 2012/0138097 A1 | 6/2012 | Okorn-Schmidt et al. | 134/19 |
| 2014/0045339 A1 | 2/2014 | Iwata et al. | 438/745 |
| 2015/0311356 A1* | 10/2015 | Nagel | H01L 31/02167 438/72 |
| 2018/0193886 A1 | 7/2018 | Abe et al. | |

(Continued)

FOREIGN PATENT DOCUMENTS

| | | |
|---|---|---|
| JP | 2004-289032 A | 10/2004 |
| JP | 2006-261685 A | 9/2006 |
| JP | 2017-175041 A | 9/2017 |

(Continued)

*Primary Examiner* — Shamim Ahmed
*Assistant Examiner* — Bradford M Gates
(74) *Attorney, Agent, or Firm* — OSTROLENK FABER LLP

(57) ABSTRACT

The substrate processing method includes a liquid film forming step of forming a liquid film of a sulfuric acid-containing liquid on a principal surface of a substrate, an ozone-containing gas exposing step of filling an ozone-containing gas inside a processing chamber capable of housing the substrate to expose the liquid film to the ozone-containing gas, and a substrate heating step of heating the substrate in a state that the substrate is disposed inside the processing chamber which is filled with the ozone-containing gas and the liquid film is also formed on the principal surface of the substrate.

9 Claims, 17 Drawing Sheets

(56) References Cited

U.S. PATENT DOCUMENTS

2020/0078833 A1\* 3/2020 Takai ................ H01L 21/68728

FOREIGN PATENT DOCUMENTS

| JP | 2018-113372 A | 7/2018 |
| JP | 2019-186461 A | 10/2019 |
| KR | 10-2003-0024727 A | 3/2003 |
| KR | 10-2018-0083249 A | 7/2018 |
| KR | 10-2019-0114892 A | 10/2019 |
| TW | 201241910 A1 | 10/2012 |
| WO | WO 01/07177 A1 | 2/2001 |

\* cited by examiner

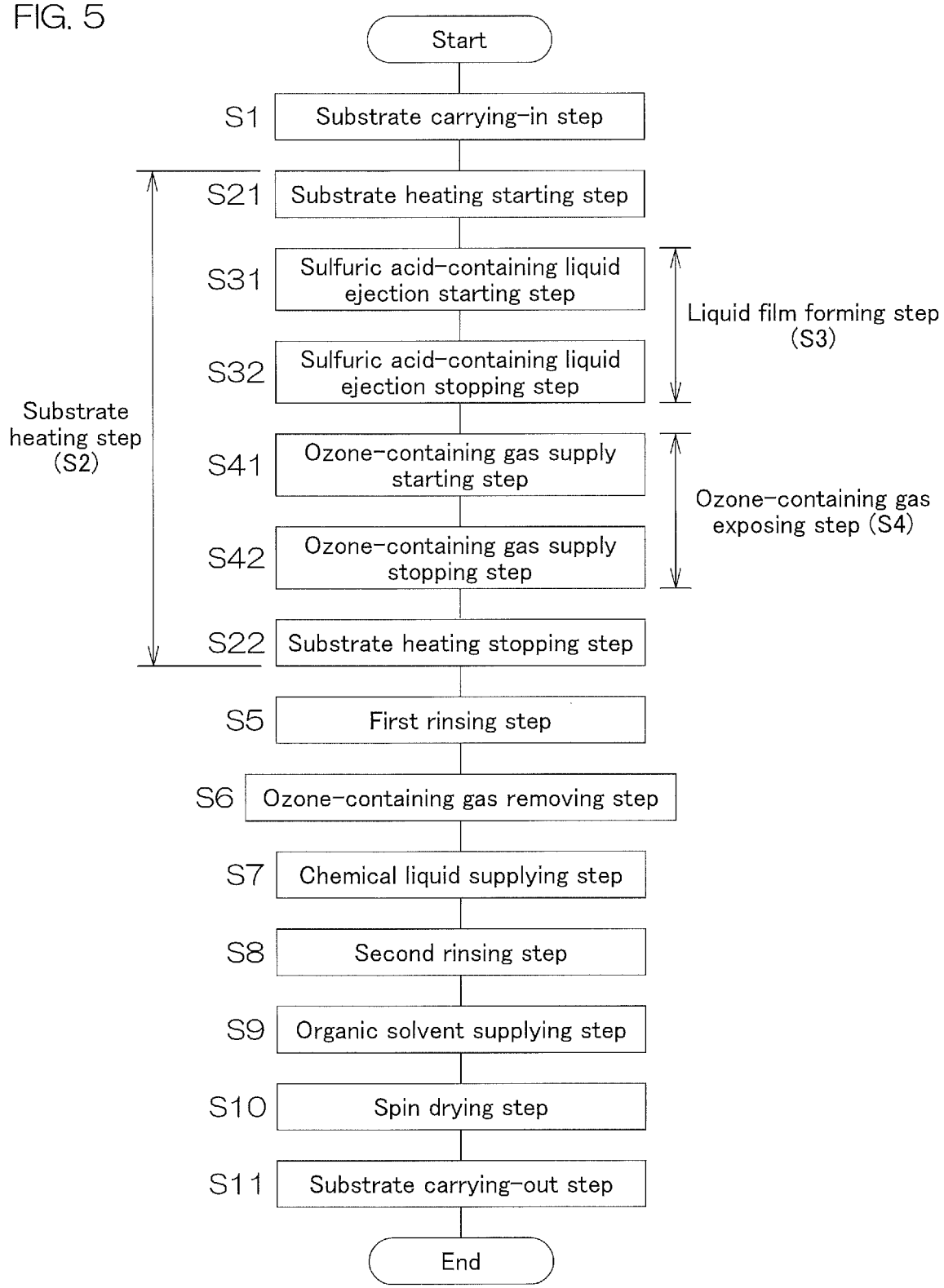

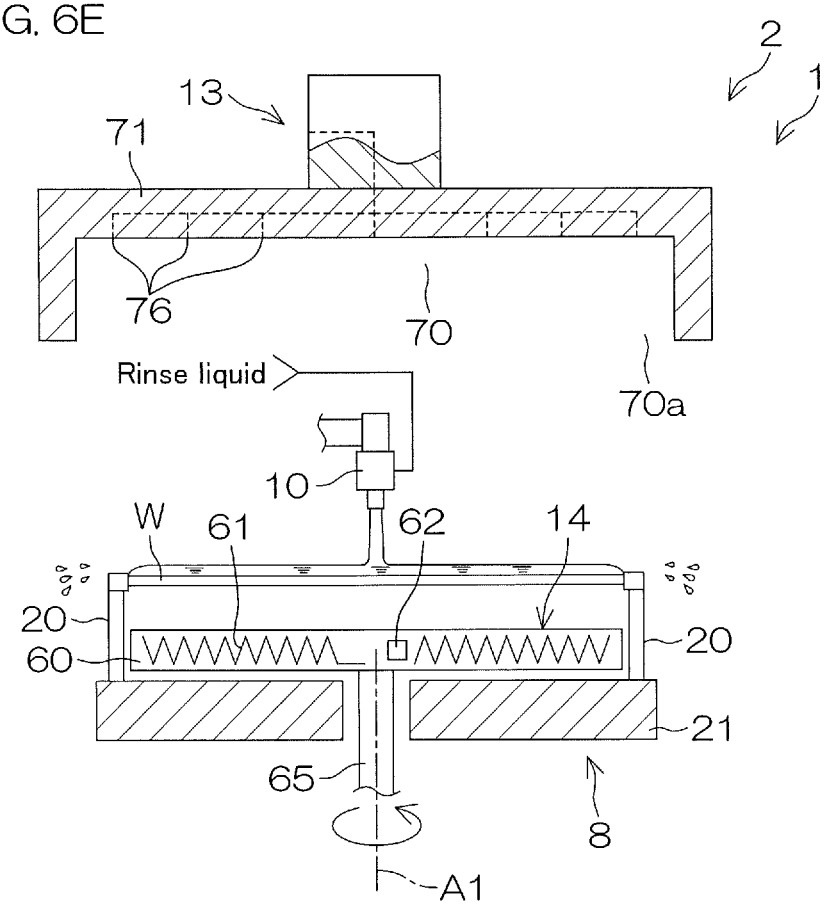

SUBSTRATE PROCESSING METHOD AND SUBSTRATE PROCESSING APPARATUS

CROSS REFERENCE TO RELATED APPLICATIONS

The present application claims priority based on Japanese Patent Application No. 2021-141268 filed on Aug. 31, 2021, the entire content of which is herein incorporated by reference.

BACKGROUND OF THE INVENTION

1. Field of the Invention

The present invention relates to a substrate processing method for processing a substrate and a substrate processing apparatus for processing a substrate. Examples of substrates to be processed include semiconductor wafers, substrates for FPDs (Flat Panel Displays) such as liquid crystal display devices, EL (Electroluminescence) display devices, etc., substrates for optical disks, substrates for magnetic disks, substrates for magneto-optical disks, substrates for photomasks, ceramic substrates, substrates for solar cells, etc.

2. Description of the Related Art

In the substrate processing apparatus disclosed in US 2014/0045339 A1, an ozone gas is supplied to sulfuric acid inside a piping to dissolve ozone into sulfuric acid, thereby forming sulfuric acid ozone. Sulfuric acid is mixed with ozone to generate peroxydisulfuric acid ($S_2O_8^{2-}$) as an etchant.

In the substrate processing apparatus disclosed in US 2014/0045339 A1, sulfuric acid ozone flows through a sulfuric acid ozone supply piping, flows into a water mixing portion, and is mixed with water, thereby forming a mixed solution of sulfuric acid ozone and water. The mixed solution of sulfuric acid ozone and water is ejected from a sulfuric acid ozone/water nozzle toward a substrate. The mixed solution of sulfuric acid ozone and water is supplied to a front surface of the substrate, with the substrate being rotated, thereby removing a resist on the front surface of the substrate.

SUMMARY OF THE INVENTION

In the substrate processing apparatus disclosed in US 2014/0045339 A1, a temperature of the mixed solution of sulfuric acid ozone and water is made higher than that of the sulfuric acid ozone before mixture due to a dilution heat generated by mixing water with the sulfuric acid ozone. Therefore, even where sulfuric acid ozone relatively low in temperature is used as the sulfuric acid ozone before mixture, it is possible to supply to the front surface of the substrate the mixed solution of sulfuric acid ozone and water at a temperature necessary for removing a resist. Further, the sulfuric acid ozone before mixture is made relatively low in temperature, thus making it possible to dissolve a large amount of ozone gas into the sulfuric acid ozone before mixture.

However, in the apparatus disclosed in US 2014/0045339 A1, sulfuric acid ozone is mixed with water to result in a decrease in concentration of peroxydisulfuric acid having an oxidizing power. Therefore, a sufficient oxidizing power may not be obtained.

Thus, an object of the present invention is to provide a substrate processing method capable of quickly and sufficiently removing an organic film such as a resist, etc., from a substrate as well as a substrate processing apparatus thereof.

A preferred embodiment of the present invention provides a substrate processing method including a liquid film forming step of forming a liquid film of a sulfuric acid-containing liquid on a principal surface of a substrate, an ozone-containing gas exposing step of filling an ozone-containing gas inside a processing chamber capable of housing the substrate to expose the liquid film to the ozone-containing gas, and a substrate heating step of heating the substrate in a state that the substrate is disposed inside the processing chamber which is filled with the ozone-containing gas and the liquid film is also formed on the principal surface of the substrate.

According to this method, the ozone-containing gas is filled inside the processing chamber, by which the liquid film of the sulfuric acid-containing liquid on the principal surface of the substrate is exposed to the ozone-containing gas. Thereby, ozone in the ozone-containing gas is dissolved into the sulfuric acid-containing liquid constituting the liquid film on the principal surface of the substrate to form peroxydisulfuric acid in the liquid film.

Further, in a state that the liquid film is formed on the principal surface of the substrate, the substrate is heated. That is, in a state that peroxydisulfuric acid is formed in the sulfuric acid-containing liquid constituting the liquid film on the principal surface of the substrate, the substrate is heated. Therefore, peroxydisulfuric acid can be increased in oxidizing power.

Still further, in a state that the ozone-containing gas is filled inside the processing chamber, the substrate is heated. Therefore, even if ozone is decreased in solubility to the sulfuric acid-containing liquid due to the heating, such a state can be kept that the ozone-containing gas which contains ozone at a sufficient concentration is in contact with the sulfuric acid-containing liquid. It is, therefore, possible to suppress gasification of ozone in the sulfuric acid-containing liquid.

As a result, an organic film such as a resist, etc., can be removed quickly and sufficiently from the substrate.

Gaseous ozone (ozone gas) is contained in the ozone-containing gas and sulfuric acid is contained in the sulfuric acid-containing liquid. The sulfuric acid-containing liquid is, for example, an aqueous sulfuric acid solution.

In a preferred embodiment of the present invention, the heating of the substrate in the substrate heating step is started before the liquid film forming step and the ozone-containing gas exposing step.

According to this method, heating of the substrate is started before the formation of the liquid film of the sulfuric acid-containing liquid and exposure of the ozone-containing gas to the liquid film. Therefore, even where a time necessary for raising a temperature of the substrate is longer than a time necessary for forming the liquid film and a time necessary for filling the ozone-containing gas, the temperature of the substrate can be brought to a desired temperature in time.

In a preferred embodiment of the present invention, the ozone-containing gas exposing step includes a pressure applying/supplying step which supplies the ozone-containing gas to the processing chamber so that a pressure inside the processing chamber is made higher than a pressure outside the processing chamber.

According to this method, the ozone-containing gas is supplied, by which the pressure inside the processing chamber is made higher than the pressure outside the processing chamber. Here, on the basis of Henry's law, the amount of a gas dissolved into a liquid is proportional to a pressure of the gas that is in contact with the liquid concerned. Therefore, the ozone-containing gas is supplied into the processing chamber to raise a pressure of the ozone-containing gas in contact with the sulfuric acid-containing liquid on the principal surface of the substrate, thus making it possible to increase a concentration of ozone in the sulfuric acid-containing liquid. Thereby, peroxydisulfuric acid in the liquid film can be increased in concentration, so that the organic film can be removed quickly and sufficiently from the principal surface of the substrate.

In a preferred embodiment of the present invention, the substrate processing method further includes a rinse liquid supplying step of supplying a rinse liquid to the principal surface of the substrate after the substrate heating step.

According to this method, the rinse liquid can be used to remove the liquid film of the sulfuric acid-containing liquid from the principal surface of the substrate. Accordingly, it is possible to prevent sulfuric acid from remaining on the principal surface of the substrate after the end of removal of the organic film from the principal surface of the substrate.

In a preferred embodiment of the present invention, the liquid film forming step includes a sulfuric acid-containing liquid supplying step which supplies the sulfuric acid-containing liquid toward the principal surface of the substrate and a film thinning step in which after the supply of the sulfuric acid-containing liquid to the principal surface of the substrate is stopped, the substrate is rotated around a central axis which passes through a central portion of the substrate to thin the sulfuric acid-containing liquid on the principal surface of the substrate, thereby forming the liquid film.

Therefore, as compared with a case that the sulfuric acid-containing liquid is spread over the entire principal surface of the substrate while a continuous flow of the sulfuric acid-containing liquid is supplied to the principal surface of the substrate, it is possible to shorten a time for supplying the sulfuric acid-containing liquid to the principal surface of the substrate. Therefore, the amount of use of the sulfuric acid-containing liquid can be reduced.

Further, as compared with a case that the sulfuric acid-containing liquid is spread over the entire principal surface of the substrate while a continuous flow of the sulfuric acid-containing liquid is supplied to the principal surface of the substrate, it is possible to thin the liquid film of the sulfuric acid-containing liquid on the principal surface of the substrate. Therefore, it is possible to shorten a time necessary for heating the liquid film of the sulfuric acid-containing liquid and realize a reduction in power consumption.

Peroxydisulfuric acid which is generated by reaction of sulfuric acid with ozone dissolved in the sulfuric acid-containing liquid from the surface of the liquid film of the sulfuric acid-containing liquid diffuses in the liquid film and reaches the principal surface of the substrate, thereby reacting with the organic film on the principal surface of the substrate. Therefore, peroxydisulfuric acid can easily reach the principal surface of the substrate by thinning the liquid film of the sulfuric acid-containing liquid. Accordingly, the organic film can be removed quickly and sufficiently from the principal surface of the substrate.

In a preferred embodiment of the present invention, the ozone-containing gas exposing step includes a step in which supply of the ozone-containing gas to the processing chamber is started in a state that the substrate having the liquid film formed on the principal surface thereof is disposed in the processing chamber, thereby filling the ozone-containing gas inside the processing chamber.

Where the liquid film of the sulfuric acid-containing liquid is formed after the supply of the ozone-containing gas to the processing chamber is ended, the ozone-containing gas may flow outside from the processing chamber to decrease in concentration of ozone in an atmosphere inside the processing chamber. Therefore, ozone which is dissolved into the sulfuric acid-containing liquid in the liquid film may be decreased in amount. Thus, supply of the ozone-containing gas is started in a state that the liquid film of the sulfuric acid-containing liquid has already been formed, by which the liquid film of the sulfuric acid-containing liquid can be brought into contact with the atmosphere inside the processing chamber, with ozone in the atmosphere inside the processing chamber kept sufficiently high in concentration. Therefore, it is possible to increase the amount of ozone which is dissolved into the sulfuric acid-containing liquid in the liquid film on the principal surface of the substrate.

In a preferred embodiment of the present invention, the substrate processing method further includes a hydrophilization step of hydrophilizing the principal surface of the substrate before the formation of the liquid film in the liquid film forming step is started.

According to this method, the principal surface of the substrate is hydrophilized before the liquid film of the sulfuric acid-containing liquid is formed on the principal surface of the substrate. Therefore, the principal surface of the substrate is improved in wettability and the sulfuric acid-containing liquid is easily spread on the principal surface of the substrate. Accordingly, it is possible to realize thinning of the liquid film of the sulfuric acid-containing liquid. Furthermore, the liquid film is made thin, by which ozone can easily reach the principal surface of the substrate, and the organic film can be quickly and sufficiently removed from the principal surface of the substrate.

In a preferred embodiment of the present invention, the hydrophilization step includes an ozone hydrophilization step in which before the formation of the liquid film in the liquid film forming step is started, the ozone-containing gas is supplied to the processing chamber in a state that the substrate is disposed inside the processing chamber, thereby exposing the principal surface of the substrate to the ozone-containing gas.

According to this method, the principal surface of the substrate can be hydrophilized by supplying the ozone-containing gas. Therefore, it is possible to use the ozone-containing gas both in hydrophilizing the principal surface of the substrate and removing the organic film from the principal surface of the substrate. Accordingly, as compared with a case that the principal surface of the substrate is hydrophilized by a method other than supply of the ozone-containing gas, it is possible to simplify equipment necessary for the substrate processing.

In a preferred embodiment of the present invention, the substrate processing method further includes a substrate holding step of causing a substrate holder disposed inside a chamber to hold the substrate. Moreover, the ozone-containing gas exposing step includes a substrate housing step in which the processing chamber is moved relatively with respect to the substrate held by the substrate holder inside the chamber to house the substrate held by the substrate holder inside the processing chamber, an ozone-containing gas supplying step in which the ozone-containing gas is supplied to the processing chamber in a state that the substrate is housed in the processing chamber, and a substrate detaching step in which after the ozone-containing gas supplying step, the processing chamber is moved relatively with respect to the substrate held by the substrate holder inside the chamber to detach the substrate held by the substrate holder from the processing chamber.

According to this method, in a state that the substrate is disposed inside the processing chamber which is disposed in the chamber, the ozone-containing gas can be supplied to the processing chamber to fill the ozone-containing gas in the processing chamber. Therefore, as compared with a case that the ozone-containing gas is filled inside the chamber, it is possible to quickly fill the ozone-containing gas.

Another preferred embodiment of the present invention includes a substrate holder to hold a substrate in a predetermined processing posture, a processing chamber which is capable of housing the substrate held by the substrate holder, a substrate heating member to heat the substrate held by the substrate holder, an ozone-containing gas supplying member to supply an ozone-containing gas into the processing chamber, a sulfuric acid-containing liquid ejecting member to eject a sulfuric acid-containing liquid toward a principal surface of the substrate held by the substrate holder, and a controller programmed to control the substrate heating member, the ozone-containing gas supplying member, and the sulfuric acid-containing liquid ejecting member.

Moreover, in a state that the substrate held by the substrate holder is disposed inside the processing chamber and the substrate is also heated by the substrate heating member, the controller causes ejection of the sulfuric acid-containing liquid from the sulfuric acid-containing liquid ejecting member toward the principal surface of the substrate to form a liquid film of the sulfuric acid-containing liquid on the principal surface of the substrate and also causes supply of the ozone-containing gas to the processing chamber from the ozone-containing gas supplying member.

According to this apparatus, in a state that the substrate disposed in the processing chamber is heated, the liquid film of the sulfuric acid-containing liquid is formed on the principal surface of the substrate and the ozone-containing gas is also supplied to the processing chamber. Therefore, the liquid film of the sulfuric acid-containing liquid is formed on the principal surface of the substrate in a state that the ozone-containing gas is filled inside the processing chamber. Accordingly, ozone in the ozone-containing gas is dissolved into the sulfuric acid-containing liquid constituting the liquid film on the principal surface of the substrate, by which peroxydisulfuric acid can be formed in the liquid film.

Further, the substrate is heated in a state that peroxydisulfuric acid is formed in the sulfuric acid-containing liquid constituting the liquid film on the principal surface of the substrate. Therefore, it is possible to increase an oxidizing power of peroxydisulfuric acid.

Still further, the substrate is heated in a state that the ozone-containing gas is filled inside the processing chamber. Therefore, even if ozone is decreased in solubility to the sulfuric acid-containing liquid due to the heating, such a state can be kept that the ozone-containing g gas which contains ozone at a sufficient concentration is in contact with the sulfuric acid-containing liquid. It is, therefore, possible to suppress gasification of ozone in the sulfuric acid-containing liquid.

As a result, an organic film such as a resist, etc., can be removed quickly and sufficiently from the substrate.

In another preferred embodiment of the present invention, the substrate processing apparatus further includes a temperature sensor to detect a temperature of the substrate heating member. Moreover, the controller includes a temperature judging unit which judges whether a detection temperature by the temperature sensor has reached a temperature within a processing temperature range or not, and a first starting unit which starts at least one of the ejection of the sulfuric acid-containing liquid from the sulfuric acid-containing liquid ejecting member and the supply of the ozone-containing gas from the ozone-containing gas supplying member when the temperature judging unit judges that the detection temperature by the temperature sensor has reached a temperature within the processing temperature range.

According to this apparatus, when the detection temperature by the temperature sensor has reached a temperature within the processing temperature range, at least one of the ejection of the sulfuric acid-containing liquid from the sulfuric acid-containing liquid ejecting member and the supply of the ozone-containing gas from the ozone-containing gas supplying member is started. Therefore, in a state that the substrate has been heated at a sufficiently high temperature, at least one of the ejection of the sulfuric acid-containing liquid from the sulfuric acid-containing liquid ejecting member and the supply of the ozone-containing gas from the ozone-containing gas supplying member is started. Accordingly, it is possible to quickly start removal of the organic film from the principal surface of the substrate.

In another preferred embodiment of the present invention, the first starting unit starts the ejection of the sulfuric acid-containing liquid from the sulfuric acid-containing liquid ejecting member when the temperature judging unit judges that the detection temperature by the temperature sensor has reached a temperature within the processing temperature range. Moreover, the controller further includes an elapsed time judging unit which judges whether a liquid film forming time has elapsed or not after the ejection of the sulfuric acid-containing liquid from the sulfuric acid-containing liquid ejecting member starts, and a second starting unit which starts the supply of the ozone-containing gas from the ozone-containing gas supplying member when the elapsed time judging unit judges that the liquid film forming time has elapsed.

According to this apparatus, when the detection temperature of the temperature sensor has reached one within the processing temperature range, ejection of the sulfuric acid-containing liquid from the sulfuric acid-containing liquid ejecting member is started. Therefore, it is possible to quickly heat the sulfuric acid-containing liquid supplied to the principal surface of the substrate. Further, when the liquid film forming time has elapsed after the start of ejection of the sulfuric acid-containing liquid, supply of the ozone-containing gas to the processing chamber is started. Therefore, supply of the ozone-containing gas to the processing chamber is quickly started after formation of the liquid film. Accordingly, it is possible to process the substrate with high reproducibility, so that the organic film can be removed from the principal surface of the substrate with high reproducibility.

In another preferred embodiment of the present invention, the substrate processing apparatus further includes a chamber which houses the substrate holder and the processing chamber, and a processing chamber driving mechanism which relatively moves the processing chamber with respect to the substrate holder so that the substrate held by the substrate holder relatively moves between the inside of the processing chamber and the outside of the processing chamber.

According to this apparatus, in a state that the substrate is disposed inside the processing chamber housed inside the chamber, the ozone-containing gas can be supplied to the processing chamber, thereby filling the ozone-containing gas in the processing chamber. Therefore, the ozone-containing gas can be quickly filled, as compared with a case that the ozone-containing gas is filled inside the chamber.

In another preferred embodiment of the present invention, the sulfuric acid-containing liquid ejecting member includes a sulfuric acid-containing liquid nozzle which ejects the sulfuric acid-containing liquid. Moreover, the substrate processing apparatus further includes a nozzle driving mechanism which moves the sulfuric acid-containing liquid nozzle to a processing position between the processing chamber and the principal surface of the substrate in a state that the substrate held by the substrate holder is positioned outside the processing chamber.

According to this apparatus, when the substrate is positioned outside the processing chamber, the sulfuric acid-containing liquid is supplied from the sulfuric acid-containing liquid nozzle to the principal surface of the substrate to form the liquid film of the sulfuric acid-containing liquid on the principal surface of the substrate and, thereafter, the substrate can be disposed inside the processing chamber. Thereby, in a configuration that the sulfuric acid-containing liquid nozzle is provided separately from the processing chamber, the ozone-containing gas can be quickly supplied to the liquid film of the sulfuric acid-containing liquid on the principal surface of the substrate.

In another preferred embodiment of the present invention, the processing chamber has a housing which demarcates an internal space of the processing chamber. Moreover, the ozone-containing gas supplying member has a plurality of ozone-containing gas ejecting ports which are exposed from the housing and connected to the internal space. Therefore, it is possible to quickly supply the ozone-containing gas to the entirety of the inside (internal space) of the processing chamber.

In another preferred embodiment of the present invention, the substrate processing apparatus further includes a sulfuric acid-containing liquid recovering unit to recover a sulfuric acid-containing liquid discharged from the principal surface of the substrate held by the substrate holder, and a sulfuric acid-containing liquid supplying unit to supply the sulfuric acid-containing liquid recovered by the sulfuric acid-containing liquid recovering unit to the sulfuric acid-containing liquid ejecting member. According to this configuration, the sulfuric acid-containing liquid supplied from the sulfuric acid-containing liquid supplying member toward the principal surface of the substrate can be recovered to reuse the sulfuric acid-containing liquid. Thereby, sulfuric acid to be discarded can be reduced in amount.

The aforementioned as well as yet other objects, features, and effects of the present invention will be made clear by the following description of preferred embodiments, with reference to the accompanying drawings.

BRIEF DESCRIPTION OF THE DRAWINGS

FIG. 5 is a flow chart for describing one example of substrate processing to be executed by the substrate processing apparatus.

FIG. 6A to FIG. 6E are each a schematic view for describing conditions of a substrate and a periphery thereof while the substrate processing is being performed.

DETAILED DESCRIPTION OF THE PREFERRED EMBODIMENTS

<Configuration of Substrate Processing Apparatus According to First Preferred Embodiment>

Figure 1:
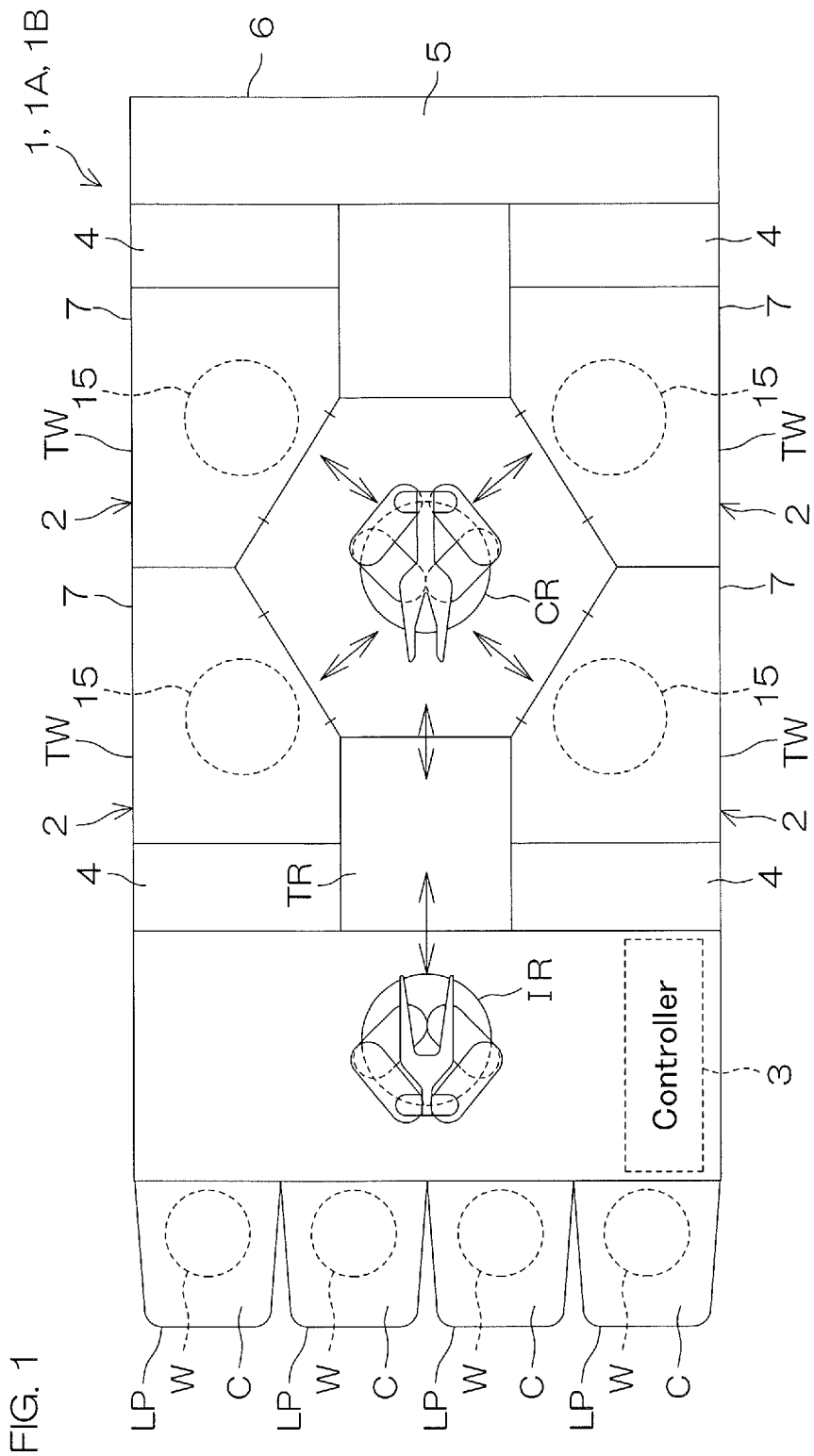
FIG. 1 is a plan view for describing a configuration example of a substrate processing apparatus according to a first preferred embodiment of the present invention.

FIG. 1 is a plan view for describing a configuration example of a substrate processing apparatus 1 according to the first preferred embodiment of the present invention.

The substrate processing apparatus 1 is a single substrate processing type apparatus which processes a substrate W one at a time. In this preferred embodiment, the substrate W is a disk-shaped substrate. The substrate W is a substrate W such as a silicon wafer and has a pair of principal surfaces.

The substrate processing apparatus 1 includes a plurality of processing units 2 which process the substrate W, a load port LP (housing vessel holding unit) on which a carrier C (housing vessel) that houses a plurality of substrates W to be processed by the processing units 2 is placed, transfer robots (a first transfer robot IR and a second transfer robot CR) which transfer the substrate W between the load port LP and the processing units 2, and a controller 3 which controls respective members provided in the substrate processing apparatus 1.

The first transfer robot IR transfers the substrate W between the carrier C and the second transfer robot CR. The second transfer robot CR transfers the substrate W between the first transfer robot IR and the processing unit 2. Each of the transfer robots is, for example, a multi-joint arm robot.

The plurality of processing units 2 are arrayed along a transfer route TR in which the substrate W is transferred by the second transfer robot CR on both sides of the transfer route TR and also arrayed by being stacked in an up/down direction. The plurality of processing units 2 have, for example, the same configuration.

The plurality of processing units 2 form four processing towers TW which are disposed respectively at four positions which are separated horizontally. Each of the processing towers TW includes the plurality of processing units 2 which are stacked in the up/down direction. Two of the four processing towers TW are disposed each at both sides of the transfer route TR extending from the load port LP toward the second transfer robot CR.

The substrate processing apparatus 1 includes a plurality of fluid boxes 4 which house a valve, a piping, etc., and a storage box 5 which houses a tank for storing a sulfuric acid-containing liquid, a chemical liquid, a rinse liquid, an organic solvent or raw materials thereof. The processing unit 2 and the fluid box 4 are disposed inside a frame 6 which is substantially in a rectangular shape in a plan view.

The processing unit 2 has a chamber 7 which houses the substrate W at the time of substrate processing. The chamber 7 includes an inlet/outlet (not shown) for carrying the substrate W into the chamber 7 by the second transfer robot CR and carrying out the substrate W from the chamber 7 and a shutter unit (not shown) for opening/closing the inlet/outlet. Although the details will be described later, processing liquids supplied to the substrate W inside the chamber 7 include a sulfuric acid-containing liquid, a chemical liquid, a rinse liquid, an organic solvent, etc.

<Configuration of Processing Unit According to First Preferred Embodiment>

Figure 2:
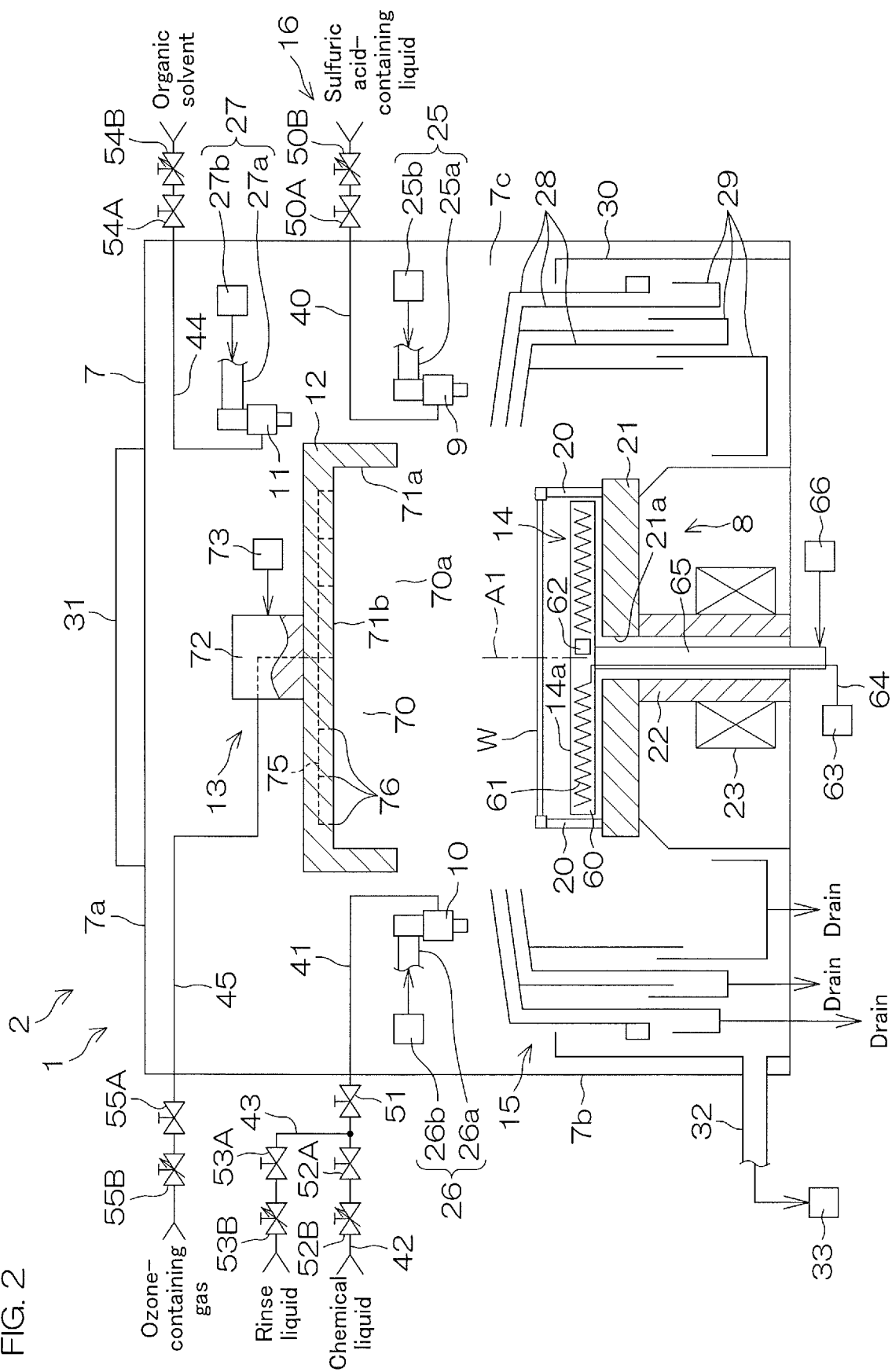
FIG. 2 is a schematic view for describing a configuration of a processing unit which is provided in the substrate processing apparatus.

FIG. 2 is a schematic view for describing a configuration of the processing unit 2.

The processing unit 2 further includes a spin chuck 8 which rotates the substrate W around a rotational axis A1 while holding the substrate W in a predetermined processing posture, a plurality of moving nozzles (first moving nozzle 9, second moving nozzle 10, third moving nozzle 11) which eject the processing liquids toward the substrate W, and a processing chamber 12 capable of housing the substrate W held by the spin chuck 8.

The processing unit 2 further includes an ozone-containing gas supplying member 13 which supplies an ozone-containing gas into the processing chamber 12, a substrate heating member 14 which heats the substrate W held by the spin chuck 8, and a processing cup 15 which receives the processing liquids scattered from the substrate W held by the spin chuck 8.

The spin chuck 8, the plurality of moving nozzles, the processing chamber 12, the ozone-containing gas supplying member 13, the substrate heating member 14, and the processing cup 15 are disposed inside the chamber 7.

The rotational axis A1 passes through a central portion of the substrate W and is orthogonal to each of the principal surfaces of the substrates W held in a processing posture. The processing posture is, for example, a posture of the substrate W shown in FIG. 2 and a horizontal posture in which the principal surface of the substrate W is a horizontal plane, but is not limited to the horizontal posture. That is, unlike in FIG. 2, the processing posture may be such a posture that the principal surface of the substrate W is inclined with respect to a horizontal plane. Where the processing posture is the horizontal posture, the rotational axis A1 extends vertically.

The spin chuck 8 is an example of a substrate holder which holds the substrate W in a processing posture and also an example of a rotation holder which rotates the substrate W around the rotational axis A1 while holding the substrate W in the processing posture.

The spin chuck 8 includes a spin base 21 which has a disk shape oriented along a horizontal direction, a plurality of gripping pins 20 which grip the substrate W above the spin base 21 and grip a peripheral edge of the substrate W at positions higher than the spin base 21, a rotational axis 22 which is coupled to the spin base 21 and extends in a vertical direction, and a rotation driving mechanism 23 which rotates the rotational axis 22 around a central axis thereof (rotational axis A1). The spin base 21 is an example of a disk-shaped base.

The plurality of gripping pins 20 are disposed on an upper surface of the spin base 21 at intervals in a circumferential direction of the spin base 21. The rotation driving mechanism 23 includes, for example, an actuator such as an electric motor, etc. The rotation driving mechanism 23 rotates the rotational axis 22, by which the spin base 21 and the plurality of gripping pins 20 are rotated around the rotational axis A1. Thereby, the substrate W is rotated around the rotational axis A1 together with the spin base 21 and the plurality of gripping pins 20.

The plurality of gripping pins 20 are movable between a closed position at which they grip the substrate W in contact with a peripheral edge of the substrate W and an open position at which they release gripping of the substrate W. The plurality of gripping pins 20 are moved by an opening/closing mechanism (not shown).

When positioned at the closed position, the plurality of gripping pins 20 grip a peripheral edge of the substrate W and hold the substrate W horizontally. When positioned at the open position, the plurality of gripping pins 20 release gripping of the substrate W and also support the peripheral edge of the substrate W from below. The opening/closing mechanism includes, for example, a link mechanism, and an actuator which imparts a driving force to the link mechanism.

The plurality of moving nozzles include the first moving nozzle 9 which ejects a continuous flow of the sulfuric acid-containing liquid toward an upper surface (upper principal surface) of the substrate W held by the spin chuck 8, the second moving nozzle 10 which ejects selectively a continuous flow of the chemical liquid and a continuous flow of the rinse liquid toward the upper surface of the substrate W held by the spin chuck 8, and the third moving nozzle 11 which ejects the organic solvent toward the upper surface of the substrate W held by the spin chuck 8.

The first moving nozzle 9 is an example of a sulfuric acid-containing liquid ejecting member to eject the sulfuric acid-containing liquid toward the principal surface (upper surface) of the substrate W held by the spin chuck 8. The second moving nozzle 10 is an example of a chemical liquid ejecting member to eject the chemical liquid toward the principal surface (upper surface) of the substrate W held by the spin chuck 8 and an example of a rinse liquid ejecting member to eject the rinse liquid toward the principal surface (upper surface) of the substrate W held by the spin chuck 8. The third moving nozzle 11 is an example of an organic solvent ejecting member to eject the organic solvent toward the principal surface (upper surface) of the substrate W held by the spin chuck 8.

The plurality of moving nozzles are respectively moved in horizontal directions by a plurality of nozzle driving mechanisms (a first nozzle driving mechanism 25, a second nozzle driving mechanism 26, and a third nozzle driving mechanism 27).

Each of the nozzle driving mechanisms can move a corresponding moving nozzle between a central position and a retreat position. The central position is a position at which the moving nozzle faces a central region of the upper surface of the substrate W. The central region of the upper surface of the substrate W is a region which includes a rotation center (central portion) in the upper surface of the substrate W and a portion around the rotation center. The retreat position is a position at which the moving nozzle does not face the upper surface of the substrate W and is a position outside the processing cup 15.

The nozzle driving mechanisms respectively include arms (a first arm 25a, a second arm 26a, and a third arm 27a) each of which supports a corresponding moving nozzle and arm driving mechanisms (a first arm driving mechanism 25b, a second arm driving mechanism 26b, and a third arm driving mechanism 27b) each of which moves a corresponding arm in a horizontal direction. Each of the arm driving mechanisms includes an actuator such as an electric motor, an air cylinder, etc.

The moving nozzle may be a pivoting nozzle which pivots around a predetermined pivoting axis or may be a linear motion nozzle which moves linearly in a direction in which a corresponding arm extends. The moving nozzle may be arranged so as to move also in a vertical direction.

The sulfuric acid-containing liquid to be ejected from the first moving nozzle 9 is, for example, an aqueous sulfuric acid solution. The aqueous sulfuric acid solution contains sulfuric acid ($H_2SO_4$) and water ($H_2O$). The aqueous sulfuric acid solution is, for example, a diluted sulfuric acid or a concentrated sulfuric acid. The sulfuric acid-containing liquid may contain a substance other than sulfuric acid and water. The sulfuric acid-containing liquid may be formed by mixing sulfuric acid with water such as DIW (deionized water), etc.

The processing unit 2 further includes a sulfuric acid-containing liquid supplying unit 16 which supplies the sulfuric acid-containing liquid to the first moving nozzle 9. The sulfuric acid-containing liquid supplying unit 16 includes a sulfuric acid-containing liquid piping 40, a sulfuric acid-containing liquid valve 50A, and a sulfuric acid-containing liquid flow rate adjusting valve 50B.

The sulfuric acid-containing liquid piping 40 is connected to the first moving nozzle 9 to guide the sulfuric acid-containing liquid to the first moving nozzle 9. The sulfuric acid-containing liquid valve 50A and the sulfuric acid-containing liquid flow rate adjusting valve 50B are provided in the sulfuric acid-containing liquid piping 40.

The sulfuric acid-containing liquid valve 50A being provided in the sulfuric acid-containing liquid piping 40, which may mean that the sulfuric acid-containing liquid valve 50A is interposed in the sulfuric acid-containing liquid piping 40. The same also applies to other valves which will be described hereinafter.

The sulfuric acid-containing liquid valve 50A opens/closes the flow path of the sulfuric acid-containing liquid piping 40. The sulfuric acid-containing liquid flow rate adjusting valve 50B adjusts a flow rate of the sulfuric acid-containing liquid inside the sulfuric acid-containing liquid piping 40. The details of a configuration of the sulfuric acid-containing liquid supplying unit 16 will be described later. When the sulfuric acid-containing liquid valve 50A is opened, the sulfuric acid-containing liquid is ejected in a continuous flow from the first moving nozzle 9.

Although not shown, the sulfuric acid-containing liquid valve 50A includes a valve body having a valve seat in the inside thereof, a valve element which opens/closes the valve seat, and an actuator which moves the valve element between the open position and the closed position. Other valves also have the same configuration.

The chemical liquid ejected from the second moving nozzle 10 contains, for example, a hydrogen peroxide solution ($H_2O_2$), hydrofluoric acid (HF), diluted hydrofluoric acid (DHF), buffered hydrofluoric acid (BHF), hydrochloric acid (HCL), HPM liquid (hydrochloric acid-hydrogen peroxide mixture), ammonia water, TMAH (tetramethyl ammonium hydroxide solution), or APM liquid (ammonia-hydrogen peroxide mixture).

The rinse liquid ejected from the second moving nozzle 10 is, for example, water such as DIW, etc. However, the rinse liquid is not limited to DIW. The rinse liquid may be DIW, carbonated water, electrolyzed ion water, aqueous hydrochloric acid solution of diluted concentration (of, for example, not less than 1 ppm and not more than 100 ppm), ammonia water of diluted concentration (of, for example, not less than 1 ppm and not more than 100 ppm), reduced water (hydrogen water), or a mixed solution which contains at least two types of these.

The second moving nozzle 10 is connected to a common piping 41 which guides a fluid to the second moving nozzle 10. A chemical liquid piping 42 which supplies the chemical liquid to the common piping 41 and a rinse liquid piping 43 which supplies the rinse liquid to the common piping 41 are connected to the common piping 41. The common piping 41 may be connected to the chemical liquid piping 42 and the rinse liquid piping 43 via a mixing valve (not shown).

The common piping 41 is provided with a common valve 51 which opens/closes the common piping 41. The chemical liquid piping 42 is provided with a chemical liquid valve 52A which opens/closes the chemical liquid piping 42 and a chemical liquid flow rate adjusting valve 52B which adjusts a flow rate of the chemical liquid inside the chemical liquid piping 42. The rinse liquid piping 43 is provided with a rinse liquid valve 53A which opens/closes the rinse liquid piping 43 and a rinse liquid flow rate adjusting valve 53B which adjusts a flow rate of the rinse liquid inside the rinse liquid piping 43.

When the chemical liquid valve 52A and the common valve 51 are opened, a continuous flow of the chemical liquid is ejected from the second moving nozzle 10. When the rinse liquid valve 53A and the common valve 51 are opened, a continuous flow of the rinse liquid is ejected from the second moving nozzle 10.

The organic solvent ejected from the third moving nozzle 11 contains at least one type of alcohols such as ethanol (EtOH), isopropanol (IPA); ethylene glycol monoalkyl ethers such as ethylene glycol monomethyl ether, ethylene glycol monoethyl ether; ethylene glycol monoalkyl ether acetates such as ethylene glycol monomethyl ether acetate, ethylene glycol monoethyl ether acetate; propylene glycol monoalkyl ethers such as propylene glycol monomethyl ether (PGME), propylene glycol monoethyl ether (PGEE); esters of lactic acid such as methyl lactate, ethyl lactate (EL); aromatic hydrocarbons such as toluene, xylene; and ketones such as methyl ethyl ketone, 2-heptane, cyclohexane. An organic solvent piping 44 which guides the organic solvent to the third moving nozzle 11 is connected to the third moving nozzle 11. The organic solvent piping 44 is provided with an organic solvent valve 54A which opens/closes the organic solvent piping 44 and an organic solvent flow rate adjusting valve 54B which adjusts a flow rate of the organic solvent inside the organic solvent piping 44.

The processing cup 15 includes a plurality (three in FIG. 2) of guards 28 which receive the processing liquids scattered outward from the substrate W held by the spin chuck 8, a plurality (three in FIG. 2) of cups 29 which respectively receive the processing liquids guided downward by the plurality of guards 28, and a cylindrically-shaped outer wall member 30 which surrounds the plurality of guards 28 and the plurality of cups 29.

Each of the guards 28 has a cylindrical form which surrounds the spin chuck 8 in a plan view. An upper end portion of each guard 28 is inclined inward so as to be toward a center side of the guard 28. Each of the cups 29 has an annular groove form which is opened upward. The plurality of guards 28 and the plurality of cups 29 are disposed coaxially.

The plurality of guards 28 are individually raised/lowered by a guard raising/lowering driving mechanism (not shown). The guard raising/lowering driving mechanism includes, for example, a plurality of actuators which raise/lower-drive the plurality of guards 28 respectively. The plurality of actuators each include at least one of the electric motor and the air cylinder.

The processing unit 2 includes a blowing unit 31 such as an FFU (fan filter unit) which sends an inert gas from the outside of the chamber 7 to the inside of the chamber 7 and a discharge piping 32 which exhausts the inside of the chamber 7. The blowing unit 31 is disposed on an upper wall 7a of the chamber 7. The discharge piping 32 is connected to the outer wall member 30. The inert gas sent to the chamber 7 by the blowing unit 31 may be, for example, a nitrogen gas, a noble gas, or a mixed gas thereof. The noble gas is, for example, an argon gas.

The discharge piping 32 is connected to an exhaust duct (not shown). An atmosphere inside the exhaust duct is suctioned by a suction device (not shown). An atmosphere inside the chamber 7 is exhausted via the discharge piping 32 into the exhaust duct. The suction device includes a suction pump, etc., which suctions the exhaust duct. The suction device is interposed in the exhaust duct or coupled to the exhaust duct. The exhaust duct and the suction device are provided in a clean room in which the substrate processing apparatus 1 is installed or inside equipment annexed to the clean room. The exhaust duct and the suction device may be a part of the substrate processing apparatus 1.

An ozone removing device 33 (ozone remover) is provided between the discharge piping 32 and the exhaust duct or in the discharge piping 32. An ozone gas which is contained in the atmosphere discharged from the chamber 7 is decomposed when passing through the ozone removing device 33.

Due to actions of the blowing unit 31 and the discharge piping 32, an air flow moving from above to below is formed in an internal space 7c of the chamber 7. The air flow passes through the inside of the processing cup 15 and flows into the discharge piping 32.

The processing liquids supplied to the substrate W and then scattered from a peripheral edge of the substrate W and are received by any of the guards 28. The processing liquids received by the guard 28 are guided to a corresponding cup 29 and recovered or discarded by a drain piping (not shown) corresponding to each of the cups 29.

The substrate heating member 14 has a form of a disk-shaped hot plate which heats the substrate W from below. The substrate heating member 14 is disposed between an upper surface of the spin base 21 and a lower surface of the substrate W. The substrate heating member 14 has a heating surface 14a which faces the lower surface of the substrate W from below.

The substrate heating member 14 includes a plate main body 60 and a heater 61. The plate main body 60 is slightly smaller than the substrate W in a plan view. An upper surface of the plate main body 60 constitutes a heating surface 14a.

The heater 61 may be a resistor which is incorporated in the plate main body 60. By energizing the heater 61, the heating surface 14a is heated.

The heater 61 is arranged so as to heat the substrate W in a temperature range which is not less than a room temperature (for example, a temperature of not less than 5° C. and not more than 25° C.) and not more than 400° C.

The processing unit 2 further includes a temperature sensor 62 which detects a temperature of the substrate heating member 14. In the example shown FIG. 2, although the temperature sensor 62 is incorporated in the plate main body 60, there is no particular restriction to disposition of the temperature sensor 62. The temperature sensor 62 may be attached externally to the plate main body 60, for example.

An energizing unit 63 is connected to the heater 61 via a current supplying line 64. A current supplied from the energizing unit 63 to the heater 61 is regulated to adjust a temperature of the heater 61. For example, the current supplied from the energizing unit 63 to the heater 61 is regulated on the basis of a detection temperature by the temperature sensor 62.

A heater raising/lowering shaft 65 is connected to a lower surface of the substrate heating member 14. The heater raising/lowering shaft 65 is inserted into a through hole 21a which is formed at a central portion of the spin base 21 and into an internal space of the rotational axis 22.

The processing unit 2 further includes a heater driving mechanism 66 which drives movement of the substrate heating member 14 in an up/down direction. The heater driving mechanism 66 includes, for example, a heater lift actuator (not shown) which drives movement of the heater raising/lowering shaft 65 in the up/down direction. The heater lift actuator includes at least one of an electric motor and an air cylinder, for example. The heater driving mechanism 66 moves the substrate heating member 14 in the up/down direction via the heater raising/lowering shaft 65. The substrate heating member 14 is movable in the up/down direction between the lower surface of the substrate W and the upper surface of the spin base 21.

The substrate heating member 14 can receive the substrate W from the plurality of gripping pins 20 positioned at the open position during raising. The substrate heating member 14 is disposed at contact position at which the heating surface 14a is in contact with the lower surface of the substrate W or at a proximity position at which it approximates to the lower surface of the substrate W without being in contact, thus making it possible to heat the substrate W. A position at which the substrate heating member 14 retreats sufficiently from the lower surface of the substrate W to such an extent to relieve the heating of the substrate W is referred to as a retreat position. The heating to the substrate W being relieved sufficiently, can be otherwise expressed as the heating to the substrate W being stopped.

An amount of heat which is transferred from the substrate heating member 14 to the substrate W when the substrate heating member 14 is disposed at the retreat position is smaller than an amount of heat transferred from the substrate heating member 14 to the substrate W when the substrate heating member 14 is disposed at the proximity position. The contact position and the proximity position are also referred to as a heating position. The retreat position is referred to as a heating relieving position or also referred to as a heating stop position.

The processing chamber 12 has an internal space 70 capable of housing the substrate W, a housing 71 which demarcates the internal space 70, and an opening 70a which is provided in the housing 71 and opens the internal space 70 to the outside of the processing chamber 12. The housing 71 has, for example, an inner circumferential surface 71a in a cylindrical shape which is larger in diameter than the substrate W in a plan view, and a flat bottom surface 71b which is connected to the inner circumferential surface 71a.

A processing chamber raising/lowering shaft 72 is connected to the processing chamber 12. The processing unit 2 further includes a processing chamber driving mechanism 73 which drives movement of the processing chamber 12 in an up/down direction. The processing chamber driving mechanism 73 includes, for example, a processing chamber actuator (not shown) which drives movement of the processing chamber raising/lowering shaft 72 in the up/down direction. The processing chamber driving mechanism 73 moves processing chamber 12 in the up/down direction via the processing chamber raising/lowering shaft 72. The processing chamber actuator includes at least one of an electric motor and an air cylinder, for example.

The processing chamber 12 is lowered, thus making it possible to relatively move the substrate W into the processing chamber 12 (internal space 70) via the opening 70a. A position of the processing chamber 12 when the processing chamber 12 houses the substrate W inside the processing chamber 12 (internal space 70) is referred to as a housing position. When the processing chamber 12 is positioned at the housing position, the inner circumferential surface 71a of the housing 71 faces the substrate W laterally. The processing chamber 12 disposed at the housing position is raised, thus making it possible to relatively move the substrate W out of the processing chamber 12 via the opening 70a. A position of the processing chamber 12 when the substrate W is positioned outside the processing chamber 12 is referred to as a non-housing position.

As described so far, the processing chamber driving mechanism 73 can move the processing chamber 12 with respect to the spin chuck 8 so that the substrate W relatively moves between the inside of the processing chamber 12 and the outside of the processing chamber 12. When the processing chamber 12 is positioned at the housing position, each the nozzle moving mechanisms cannot move a corresponding moving nozzle to a position to face the upper surface of the substrate W. When the processing chamber 12 is positioned at the non-housing position, each of the nozzle moving mechanisms can move a corresponding moving nozzle to the position to face the upper surface of the substrate W.

The ozone-containing gas supplying member 13 includes an ozone-containing gas flow channel 75 which is provided inside the housing 71 and a plurality of ozone-containing gas ejecting ports 76 which are exposed from the housing 71 and connected to one end of the ozone-containing gas flow channel 75 and the internal space 70. Therefore, the ozone-containing gas can be quickly supplied to the entirety of the internal space 70. In the example shown in FIG. 2, the plurality of ozone-containing gas ejecting ports 76 are formed in the bottom surface 71b of the housing 71.

The ozone-containing gas flow channel 75 may be constituted of a flow-through hole which is formed in the processing chamber raising/lowering shaft 72 and the housing 71 or may be constituted of a piping disposed inside the flow-through hole. The ozone-containing gas flow channel 75 may be formed only in the housing 71 without being formed in the processing chamber raising/lowering shaft 72.

The ozone-containing gas ejected from the ozone-containing gas ejecting port 76 may be an ozone gas or may be a mixed gas of an ozone gas with a gas other than an ozone gas. The gas other than an ozone gas is, for example, an inert gas. The inert gas contained in the ozone-containing gas may be, for example, a nitrogen gas, a noble gas, or a mixed gas thereof. The noble gas is, for example, an argon gas.

The ozone-containing gas flow channel 75 of the ozone-containing gas supplying member 13 is connected to an ozone-containing gas piping 45 which guides the ozone-containing gas to the ozone-containing gas flow channel 75. The ozone-containing gas piping 45 is provided with an ozone-containing gas valve 55A which opens/closes the ozone-containing gas piping 45 and an ozone-containing gas flow rate adjusting valve 55B which adjusts a flow rate of the ozone-containing gas inside the ozone-containing gas piping 45.

<Configuration of Sulfuric Acid-Containing Liquid Supplying Unit>

Figure 3:
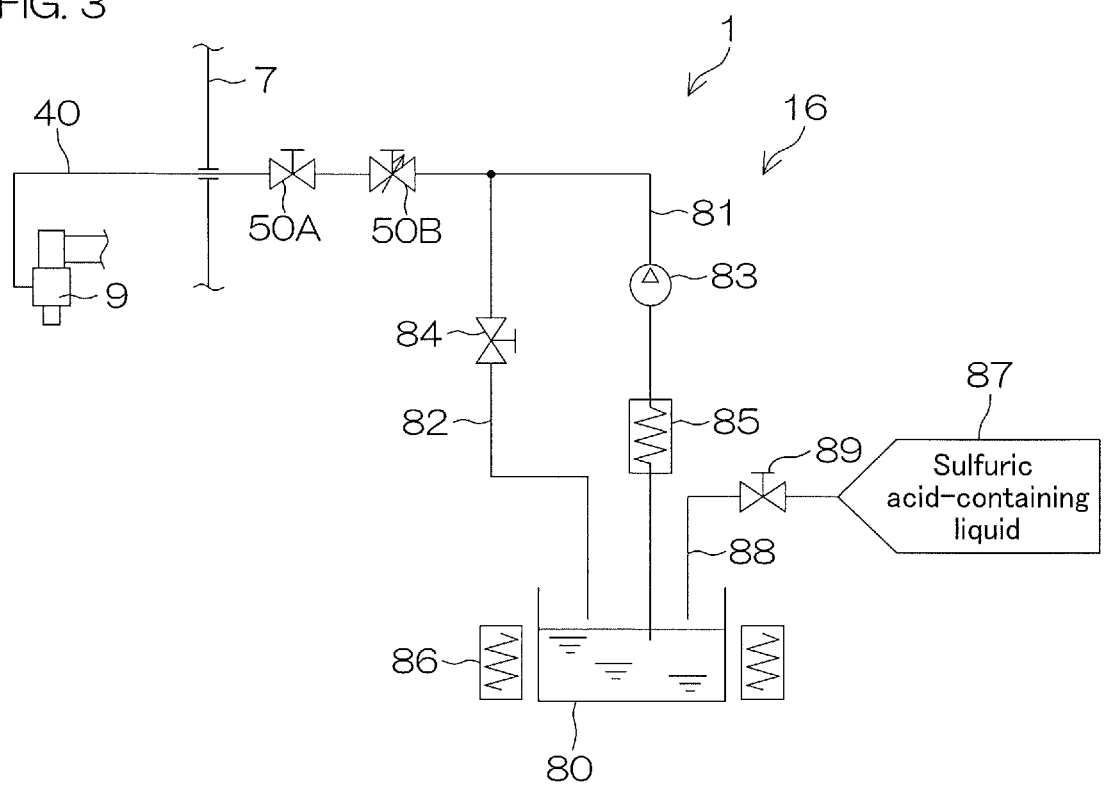
FIG. 3 is a schematic view for describing a configuration of a sulfuric acid-containing liquid supplying unit which is provided in the substrate processing apparatus.

FIG. 3 is a schematic view for describing a configuration of the sulfuric acid-containing liquid supplying unit 16.

The sulfuric acid-containing liquid supplying unit 16 further includes a storage tank 80, a supply piping 81, a circulation piping 82, a liquid feeding pump 83, a circulation valve 84, a piping heater 85, and a tank heater 86.

The storage tank 80 stores the sulfuric acid-containing liquid. The supply piping 81 is connected to the storage tank 80 and the sulfuric acid-containing liquid piping 40 to supply the sulfuric acid-containing liquid inside the storage tank 80 toward the sulfuric acid-containing liquid piping 40. The circulation piping 82 is connected to the position at which the supply piping 81 is connected to the sulfuric acid-containing liquid piping 40 to return the sulfuric acid-containing liquid inside the supply piping 81 to the storage tank 80, thereby circulating the sulfuric acid-containing liquid inside the storage tank 80. The liquid feeding pump 83 generates a driving force to send the sulfuric acid-containing liquid inside the storage tank 80 to the supply piping 81. The circulation valve 84 is provided in the circulation piping 82 to open/close the circulation piping 82.

The piping heater 85 heats the sulfuric acid-containing liquid inside the supply piping 81. The tank heater 86 heats the sulfuric acid-containing liquid inside the storage tank 80. The form of the piping heater 85 or that of the tank heater 86 is not particularly restricted. The piping heater 85 heats, for example, the supply piping 81 externally, thereby heating the sulfuric acid-containing liquid which passes through the inside of the supply piping 81. The tank heater 86 is, for example, a heater which is attached on an outer surface of a wall portion of the storage tank 80.

The sulfuric acid-containing liquid supplying unit 16 further includes a refilling piping 88 which refills a new sulfuric acid-containing liquid (new liquid) into the storage tank 80 from a sulfuric acid-containing liquid supplying source 87 and a refilling valve 89 which opens/closes the refilling piping 88. The refilling valve 89 is opened to supply the new liquid to the storage tank 80.

<Electrical Configuration of Substrate Processing According to First Preferred Embodiment>

Figure 4:
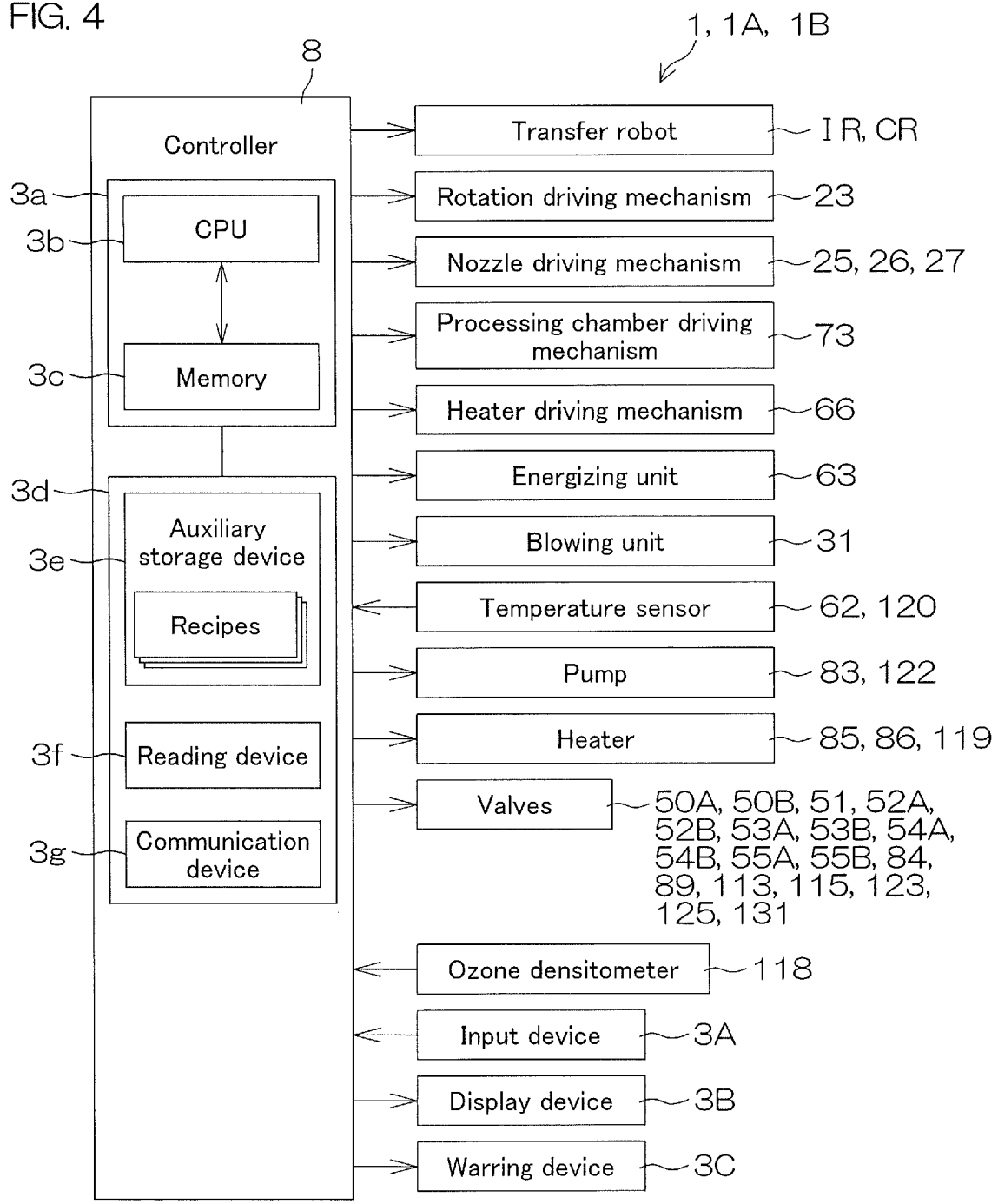
FIG. 4 is a block diagram for describing an electrical configuration of the substrate processing apparatus.

FIG. 4 is a block diagram for describing an electrical configuration of the substrate processing apparatus 1.

The controller 3 is a computer which includes a computer main body 3a and a peripheral device 3d connected to the computer main body 3a. The computer main body 3a includes a processor (CPU) 3b which executes various types of commands and a memory 3c which stores information.

The peripheral device 3d includes an auxiliary storage device 3e which stores information such as programs, etc., a reading device 3f which reads information from a removable medium (not shown) and a communication device 3g such as a host which communicates with other devices computer (not shown).

The controller 3 is connected to an input device 3A, a display device 3B, and an alarm device 3C. The input device 3A is operated when an operator such as a user and a person in charge of maintenance inputs information to the substrate processing apparatus 1. The information is displayed on a screen of the display device 3B. The input device 3A may be any one of a keyboard, a pointing device, and a touch panel or may be any other device. A touch panel display which acts as the input device 3A and the display device 3B may be provided in the substrate processing apparatus 1. The alarm device 3C sends out an alarm by using one or more of light, sounds, characters, and figures. When the input device 3A is the touch panel display, the input device 3A may be used also as the alarm device 3C.

The auxiliary storage device 3e is a non-volatile memory which keeps memory without power supply. The auxiliary storage device 3e is, for example, a magnetic storage device such as a hard disk drive.

The auxiliary storage device 3e stores a plurality of recipes. The recipes are information which specifies processing contents, processing conditions, and processing procedures of the substrate W. The plurality of recipes are different at least in one of the processing contents, the processing conditions, and the processing procedures of the substrate W.

The controller 3 controls the respective members provided in the substrate processing apparatus 1 so that the substrate W can be processed according to the recipes designated by an external device such as a host computer.

Control targets of the controller 3 include the first transfer robot IR, the second transfer robot CR, the rotation driving mechanism 23, the first nozzle driving mechanism 25, the second nozzle driving mechanism 26, the third nozzle driving mechanism 27, the processing chamber driving mechanism 73, the heater driving mechanism 66, the energizing unit 63, the blowing unit 31, the temperature sensor 62, the liquid feeding pump 83, the piping heater 85, the tank heater 86, the sulfuric acid-containing liquid valve 50A, the sulfuric acid-containing liquid flow rate adjusting valve 50B, the common valve 51, the chemical liquid valve 52A, the chemical liquid flow rate adjusting valve 52B, the rinse liquid valve 53A, the rinse liquid flow rate adjusting valve 53Ba, the organic solvent valve 54A, the organic solvent flow rate adjusting valve 54B, the circulation valve 84, and the refilling valve 89, etc.

Further, although representative members are illustrated in FIG. 4, members that are not illustrated shall not be interpreted as not being controlled by the controller 3. The controller 3 can appropriately control each of the members provided in the substrate processing apparatus 1. Members that are to be described in second and third preferred embodiments which will be described later are also illustrated in FIG. 4, and these members are also controlled by the controller 3.

The following steps are executed by the controller 3 which h controls the substrate processing apparatus 1. In other words, the controller 3 is programmed so as to execute each of the following steps.

<One Example of Substrate Processing>

FIG. 5 is a flow chart for describing one example of the substrate processing to be executed by the substrate processing apparatus 1. FIG. 6A to FIG. 6E are each a schematic view for describing conditions of the substrate W and a periphery thereof while the substrate processing is being performed. At least one of the pair of principal surfaces of the substrate W which are used in the substrate processing, an organic film such as a resist, etc., is formed.

In the substrate processing by the substrate processing apparatus 1, as shown in FIG. 5, for example, a substrate carrying-in step (Step S1), a substrate heating step (Step S2), a liquid film forming step (Step S3), an ozone-containing gas exposing step (Step S4), a first rinsing step (Step S5), an ozone-containing gas removing step (Step S6), a chemical liquid supplying step (Step S7), a second rinsing step (Step S8), an organic solvent supplying step (Step S9), a spin drying step (Step S10) and a substrate carrying-out step (Step S11) are executed. Hereinafter, details of the substrate processing will be described with reference mainly to FIG. 2 and FIG. 5. FIG. 6A to FIG. 6E are referred to whenever appropriate.

First, a substrate W which is to be processed is carried into the processing unit 2 from the carrier C by the second transfer robot CR (refer to FIG. 1) and passed to the spin chuck 8 (substrate carrying-in step: Step S1). Thereby, the substrate W is held horizontally by the spin chuck 8 (substrate holding step). At this time, the substrate W is held by the spin chuck 8 so that the principal surface on which the organic film has been formed will be an upper surface. The substrate W is held continuously by the spin chuck 8 until completion of the spin drying step (Step S10).

In a state that the substrate W is held by the spin chuck 8, the rotation driving mechanism 23 starts to rotate the substrate W (substrate rotating step). Further, during execution of the substrate processing, an air flow which moves from above to below is constantly formed in the internal space 7c of the chamber 7, and the air flow passes through the inside of the processing cup 15 and flows into the discharge piping 32.

Figure 6A:
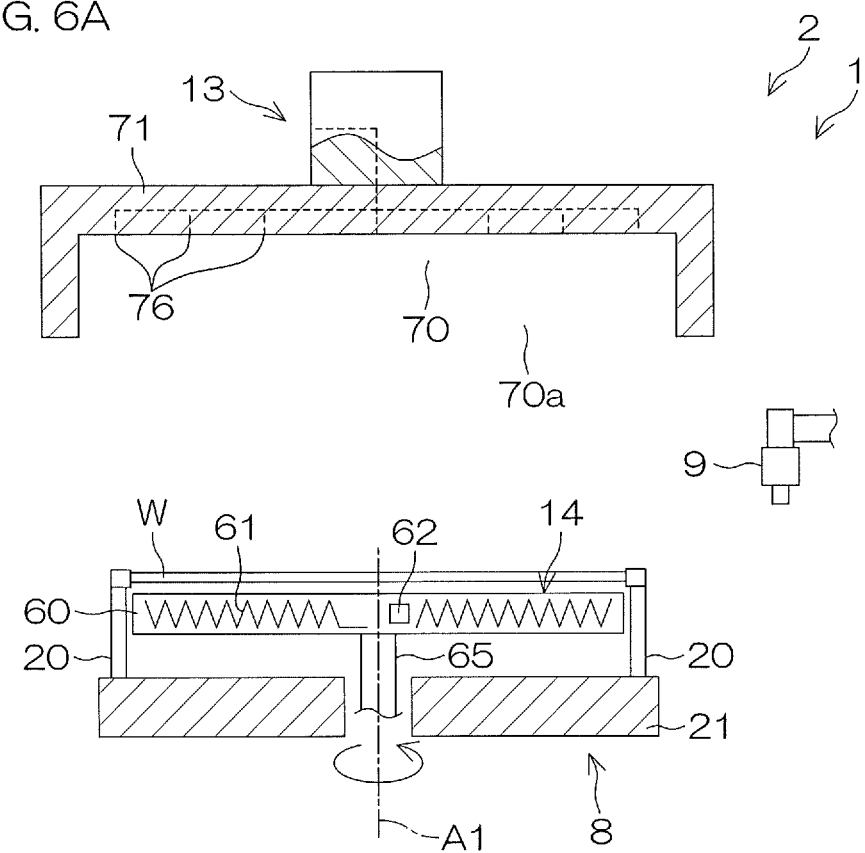

After the second transfer robot CR has retreated from the chamber 7, the substrate heating step (Step S2) which heats the substrate W is executed. Specifically, a current is supplied to the heater 61 by the energizing unit 63, and a temperature rise of the heater 61 is started. Then, the heater driving mechanism 66 moves the substrate heating member 14 from the retreat position to the proximity position. As shown in FIG. 6A, a temperature rise of the heater 61 is started and the substrate heating member 14 is disposed at the proximity position, by which heating of the substrate W is started (substrate heating start step: Step S21).

Then, when the detection temperature of the temperature sensor 62 has reached a processing temperature range, the liquid film forming step (Step S3) is executed in which a liquid film 100 (refer to FIG. 6C) of the sulfuric acid-containing liquid is formed on the upper surface of the substrate W. Specifically, the first nozzle driving mechanism 25 moves the first moving nozzle 9 to a processing position. The processing position is, for example, a central position.

Figure 6B:
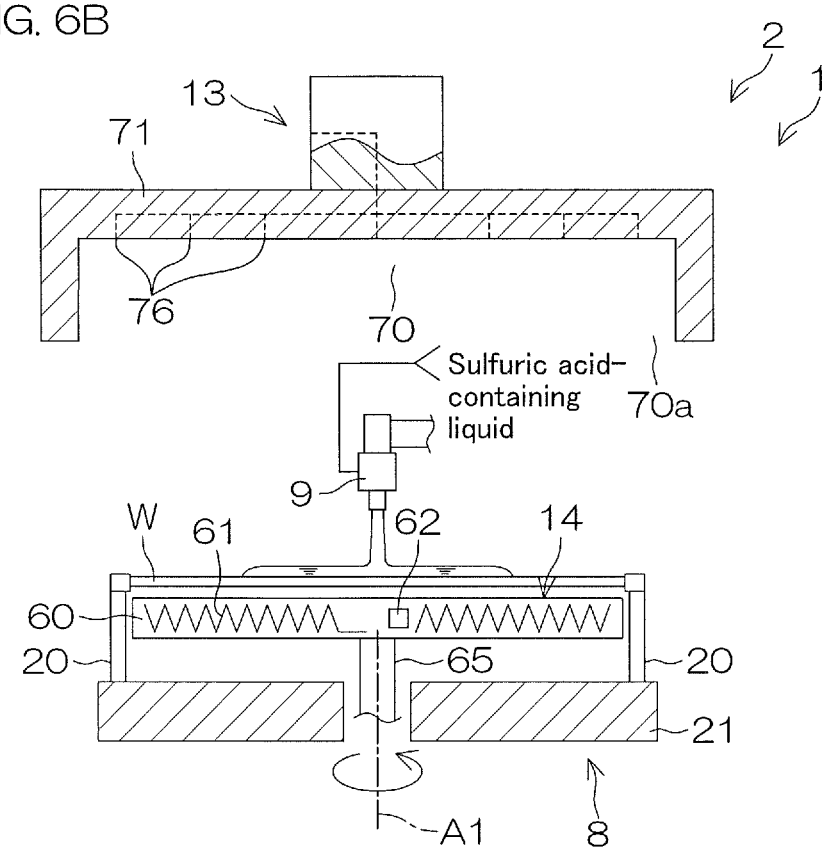

In a state that the first moving nozzle 9 is positioned at the processing position, the sulfuric acid-containing liquid valve 50A is opened. Thereby, as shown in FIG. 6B, the sulfuric acid-containing liquid is ejected from the first moving nozzle 9, thereby starting supply of the sulfuric acid-containing liquid to the upper surface of the substrate W (sulfuric acid-containing liquid supply starting step: Step S31). The sulfuric acid-containing liquid which has landed on the upper surface of the substrate W moves toward a peripheral edge of the upper surface of the substrate W, and the sulfuric acid-containing liquid spreads over the entire upper surface of the substrate W.

When a predetermined period of time has elapsed after the start of supplying the sulfuric acid-containing liquid, the sulfuric acid-containing liquid valve 50A is closed. Thereby, the supply of the sulfuric acid-containing liquid to the upper surface of the substrate W is stopped (sulfuric acid-containing liquid supply stopping step: Step S32). An ejection period of time of the sulfuric acid-containing liquid is, for example, about one second.

Figure 6C:
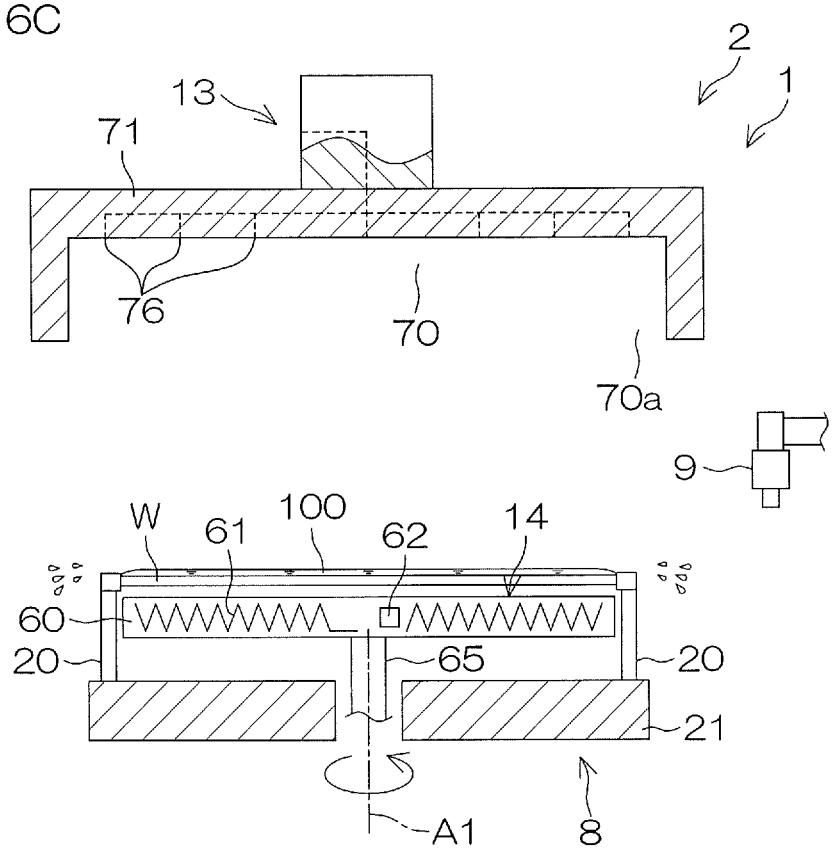

No sulfuric acid-containing liquid is supplied to the upper surface of the substrate W, and a centrifugal force by rotation of the substrate W is used to remove the sulfuric acid-containing liquid from the upper surface of the substrate W, by which the sulfuric acid-containing liquid on the upper surface of the substrate W is thinned (film thinning step). Thereby, as shown in FIG. 6C, a thin liquid film 100 of the sulfuric acid-containing liquid is formed on the upper surface of the substrate W. The liquid film 100 has a thickness of not less than 1 μm and not more than 2 mm, for example.

At a time point when ejection of the sulfuric acid-containing liquid is stopped, the sulfuric acid-containing liquid is not required to spread over the entire upper surface of the substrate W but may spread up to a peripheral edge of the upper surface of the substrate W after supply of the sulfuric acid-containing liquid is stopped. If the ejection of the sulfuric acid-containing liquid is stopped before the sulfuric acid-containing liquid spreads over the entire substrate W, it possible to further reduce the amount of the sulfuric acid-containing liquid to be supplied.

After the ejection of the sulfuric acid-containing liquid is stopped, the first nozzle driving mechanism 25 allows the first moving nozzle 9 to retreat. When a predetermined period of time has elapsed after stopping ejection of the sulfuric acid-containing liquid, the ozone-containing gas exposing step (Step S4) is executed. The ozone-containing gas exposing step is a step in which the ozone-containing gas is filled into the processing chamber 12 to expose the liquid film 100 on the upper surface of the substrate W to the ozone-containing gas.

Figure 6D:
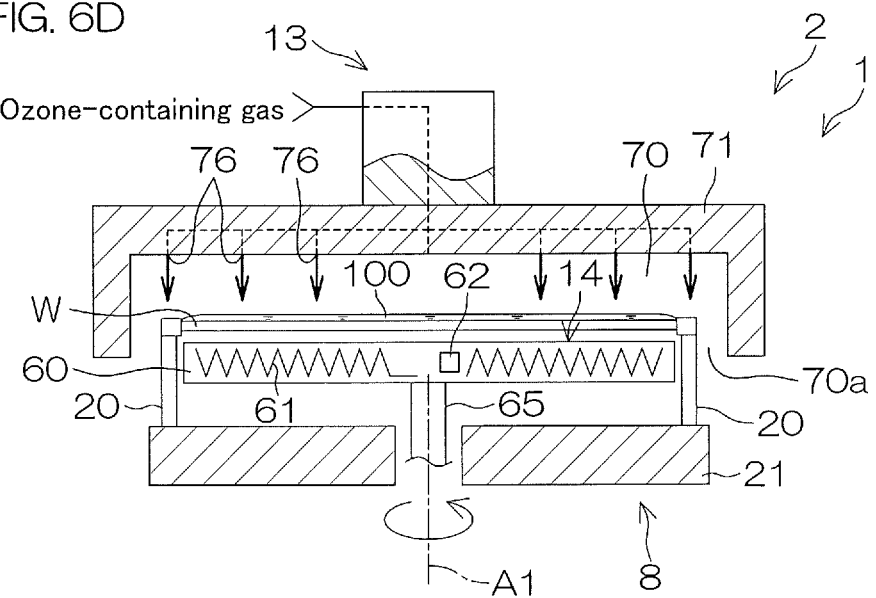

Specifically, at a time point when a predetermined period of time has elapsed after stopping ejection of the sulfuric acid-containing liquid, the processing chamber driving mechanism 73 lowers the processing chamber 12 from the non-housing position toward the housing position. Thereby, the substrate W is housed inside the processing chamber 12 (substrate housing step). In a state that the processing chamber 12 is disposed at the housing position, the ozone-containing gas valve 55A is opened. Thereby, as shown in FIG. 6D, the ozone-containing gas is supplied into the processing chamber 12 (ozone-containing gas supply starting step: Step S41). The ozone-containing gas is supplied into the processing chamber 12 to fill the ozone-containing gas inside the processing chamber 12 (ozone-containing gas supplying step, ozone-containing gas filling step).

The substrate W is disposed inside the processing chamber 12 which is filled with the ozone-containing gas, thus making it possible to expose the liquid film 100 on the upper surface of the substrate W to the ozone-containing gas (ozone-containing gas exposing step).

The ozone-containing gas is supplied to the inside of the processing chamber 12, by which a pressure can be applied to the inside of the processing chamber 12 (pressure applying/supplying step). Thereby, a pressure inside the processing chamber 12 is made higher than a pressure outside the processing chamber 12. The pressure outside the processing chamber 12 in the chamber 7 is, for example, an atmospheric pressure, which is about 0.1 MPa. The pressure inside the processing chamber 12 is, for example, not less than 0.1 MPa and not more than 0.2 MPa. The substrate W is disposed inside the processing chamber 12 to narrow the opening 70a, thus making it possible to easily raise the pressure inside the processing chamber 12.

After a predetermined period of time has elapsed since the supply of the ozone-containing gas into the processing chamber 12, the ozone-containing gas valve 55A is closed and the processing chamber driving mechanism 73 also moves the processing chamber 12 from the housing position toward the non-housing position.

The ozone-containing gas valve 55A is closed to stop the supply of the ozone-containing gas to the processing chamber 12 (ozone-containing gas supply stopping step: Step S42). The processing chamber driving mechanism 73 raises the processing chamber 12 from the housing position toward the non-housing position. Thereby, the substrate W is detached from the processing chamber 12 (substrate detaching step). The substrate W is detached from the processing chamber 12, thus making it possible to stop the exposure of the ozone-containing gas to the liquid film 100 on the upper surface of the substrate W. Thereby, the ozone-containing gas exposing step (Step S4) is ended. The substrate detaching step may be executed before the ozone-containing gas valve 55A is closed.

Strictly speaking, the ozone-containing gas remains inside the chamber 7. However, the processing chamber 12 is disposed at the non-housing position, thus making it possible to decrease the concentration of an ozone gas in an atmosphere in contact with the liquid film 100 on the upper surface of the substrate W. Thus, reducing the concentration of the ozone gas in an atmosphere in contact with the liquid film 100 on the upper surface of the substrate W is referred to as stopping of exposure of the ozone-containing gas.

After the exposure of the ozone-containing gas to the liquid film 100 on the upper surface of the substrate W is stopped, the heater driving mechanism 66 moves the substrate heating member 14 from the proximity position to the retreat position. The substrate heating member 14 is disposed at the retreat position (position shown in FIG. 6E) to stop the heating of the substrate W (substrate heating stopping step: Step S22). Thereby, the substrate heating step (Step S2) is ended.

The substrate heating step (Step S2), the liquid film forming step (Step S3), and the ozone-containing gas exposing step (Step S4) are executed to dissolve the organic film on the substrate W into the sulfuric acid-containing liquid, thereby removing the organic film from the upper surface of the substrate W. There may be a case that the organic film is not completely dissolved into the sulfuric acid-containing liquid and peeled from the upper surface of the substrate W by a liquid flow of the sulfuric acid-containing liquid.

After the substrate heating step (Step S2), the liquid film forming step (Step S3) and the ozone-containing gas exposing step (Step S4), the first rinsing step (Step S5) is executed in which the rinse liquid on the upper surface of the substrate W is supplied to clean the upper surface of the substrate W.

Specifically, the second nozzle driving mechanism 26 moves the second moving nozzle 10 to a processing position. The processing position is, for example, a central position. In a state that the second moving nozzle 10 is positioned at the processing position, the common valve 51 and the rinse liquid valve 53A are opened. Thereby, as shown in FIG. 6E, the rinse liquid is ejected from the second moving nozzle 10 to start supply of the rinse liquid to the upper surface of the substrate W (rinse liquid supply starting step, rinse liquid supplying step). The rinse liquid which has landed on the upper surface of the substrate W moves toward a peripheral edge of the upper surface of the substrate W, and the rinse liquid spreads over the entire upper surface of the substrate W.

When a predetermined period of time has elapsed after the start of supplying the rinse liquid, the common valve 51 and the rinse liquid valve 53A are closed. Thereby, the supply of the rinse liquid to the upper surface of the substrate W is stopped (rinse liquid supply stopping step). Thereby, the first rinsing step is ended. The sulfuric acid-containing liquid is discharged from the upper surface of the substrate W by the first rinsing step. The organic film peeled from the upper surface of the substrate W is removed from the upper surface of the substrate W, together with the sulfuric acid-containing liquid.

After the supply of the rinse liquid to the upper surface of the substrate W is stopped, the ozone-containing gas removing step (Step S6) is executed in which the ozone-containing gas is removed from the processing chamber 12 and the chamber 7. Specifically, at least one of a supply flow rate of an inert gas by the blowing unit 31 and an exhaust flow rate of the gas from the discharge piping 32 is adjusted to remove the ozone-containing gas from the processing chamber 12 and the chamber 7.

After the ozone-containing gas removing step (Step S6), the chemical liquid supplying step (Step S7) is executed in which the chemical liquid is supplied to the upper surface of the substrate W. Specifically, in a state that the second moving nozzle 10 is positioned at the processing position, the common valve 51 and the chemical liquid valve 52A are opened. Thereby, the ejection of the rinse liquid is stopped, and further, a continuous flow of the chemical liquid is ejected (supplied) from the second moving nozzle 10 toward the upper surface of the substrate W (chemical liquid ejecting step, chemical liquid supplying step). Thereby, the upper surface of the substrate W is processed by the chemical liquid.

After the chemical liquid supplying step (Step S7), the second rinsing step (Step S8) is executed in which the rinse liquid is supplied to the upper surface of the substrate W to clean the upper surface of the substrate W. Specifically, while such a state is kept that the second moving nozzle 10 faces the upper surface of the substrate W and the common valve 51 is also opened, the chemical liquid valve 52A is closed and the rinse liquid valve 53A is opened. Thereby, the ejection of the chemical liquid from the second moving nozzle 10 is stopped, and further, a continuous flow of the rinse liquid is ejected (supplied) from the second moving nozzle 10 toward the upper surface of the substrate W (rinse liquid ejecting step, rinse liquid supplying step). Thereby, the chemical liquid on the upper surface of the substrate W is discharged outside the substrate W together with the rinse liquid to clean the upper surface of the substrate W.

After the second rinsing step (Step S8), the organic solvent supplying step (Step S9) is executed in which the organic solvent is supplied to the upper surface of the substrate W. Specifically, the ejection of the rinse liquid from the second moving nozzle 10 is stopped and the second moving nozzle 10 is also allowed to retreat. Then, the third nozzle driving mechanism 27 allows the third moving nozzle 11 to face the upper surface of the substrate W and the organic solvent valve 54A is opened. Thereby, a continuous flow of the organic solvent is ejected (supplied) from the third moving nozzle 11 toward the upper surface of the substrate W (organic solvent ejecting step, organic solvent supplying step). Thereby, the rinse liquid on the upper surface of the substrate W is replaced with the organic solvent.

The organic used in the substrate processing is preferably higher in volatility than the rinse liquid. If so, the rinse liquid is replaced with the organic solvent, by which the substrate W can be favorably dried in the subsequent spin drying step (Step S10). The organic solvent used in the substrate processing is preferably lower in surface tension than the rinse liquid. If so, where an indented pattern is formed on the upper surface of the substrate W, it is possible to decrease the surface tension acting on the indented pattern when drying the upper surface of the substrate W and suppress collapse of the indented pattern.

Next, the spin drying step (Step S10) is executed in which the substrate W is rotated with high speed to dry the upper surface of the substrate W. Specifically, the organic solvent valve 54A is closed to stop the supply of the organic solvent to the upper surface of the substrate W. Then, the rotation driving mechanism 23 accelerates the rotation of the substrate W, thereby rotating the substrate W with high speed (for example, 1500 rpm). Thereby, a large centrifugal force is applied to the rinse liquid adhering to the substrate W, and the organic solvent is spun off to a periphery of the substrate W.

After the spin drying step (Step S10), the rotation driving mechanism 23 stops the rotation of the substrate W. Thereafter, the second transfer robot CR enters into the processing unit 2, receives the substrate W which has been processed from the spin chuck 8 and carries it out of the processing unit 2 (substrate carrying-out step: Step S11). The substrate W is passed from the second transfer robot CR to the first transfer robot IR and housed in a carrier C by the first transfer robot IR.

<Functional Configuration of Controller>

Figure 7:
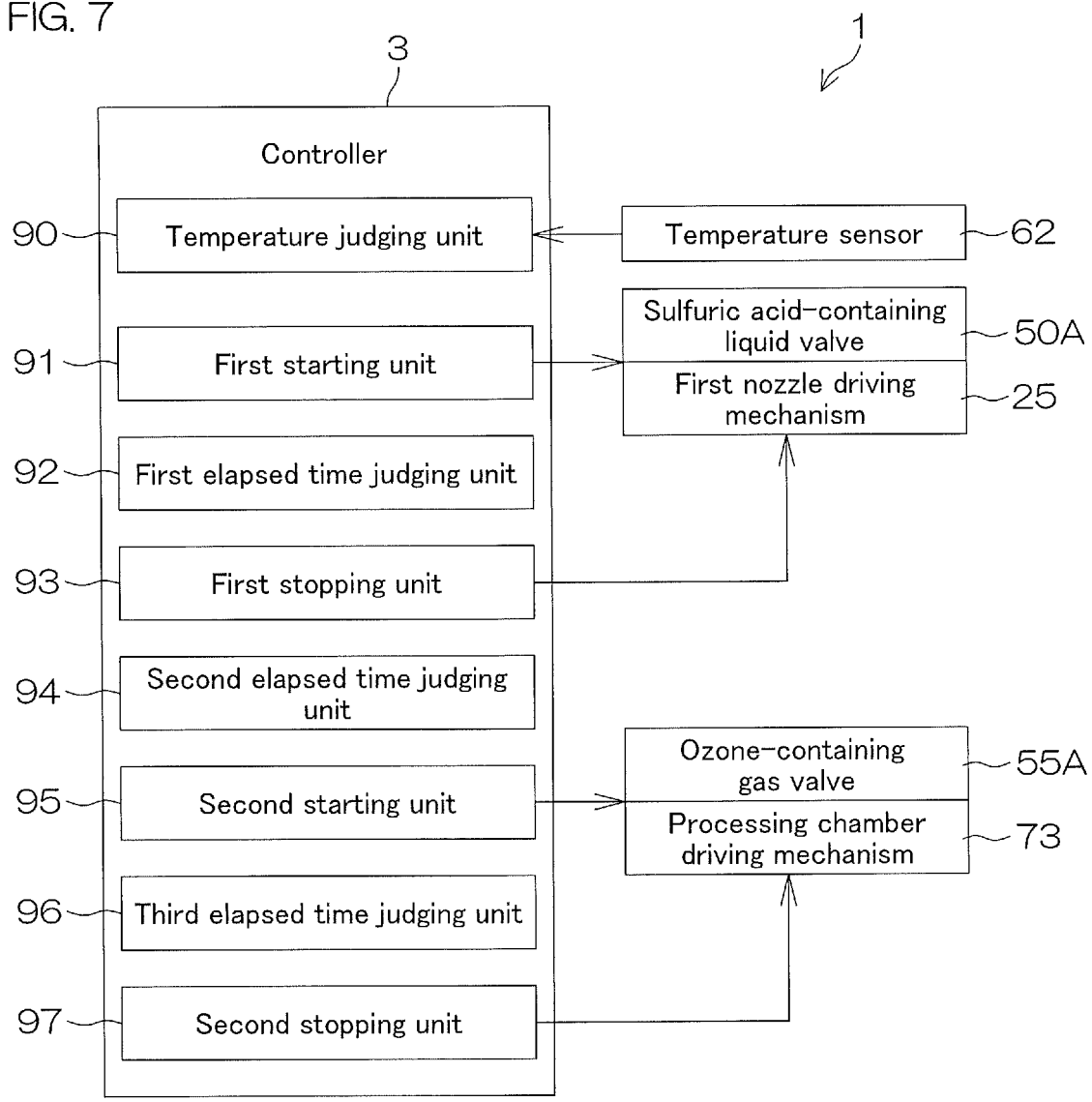
FIG. 7 is a block diagram for describing a functional configuration of a controller provided in the substrate processing apparatus.
Figure 8:
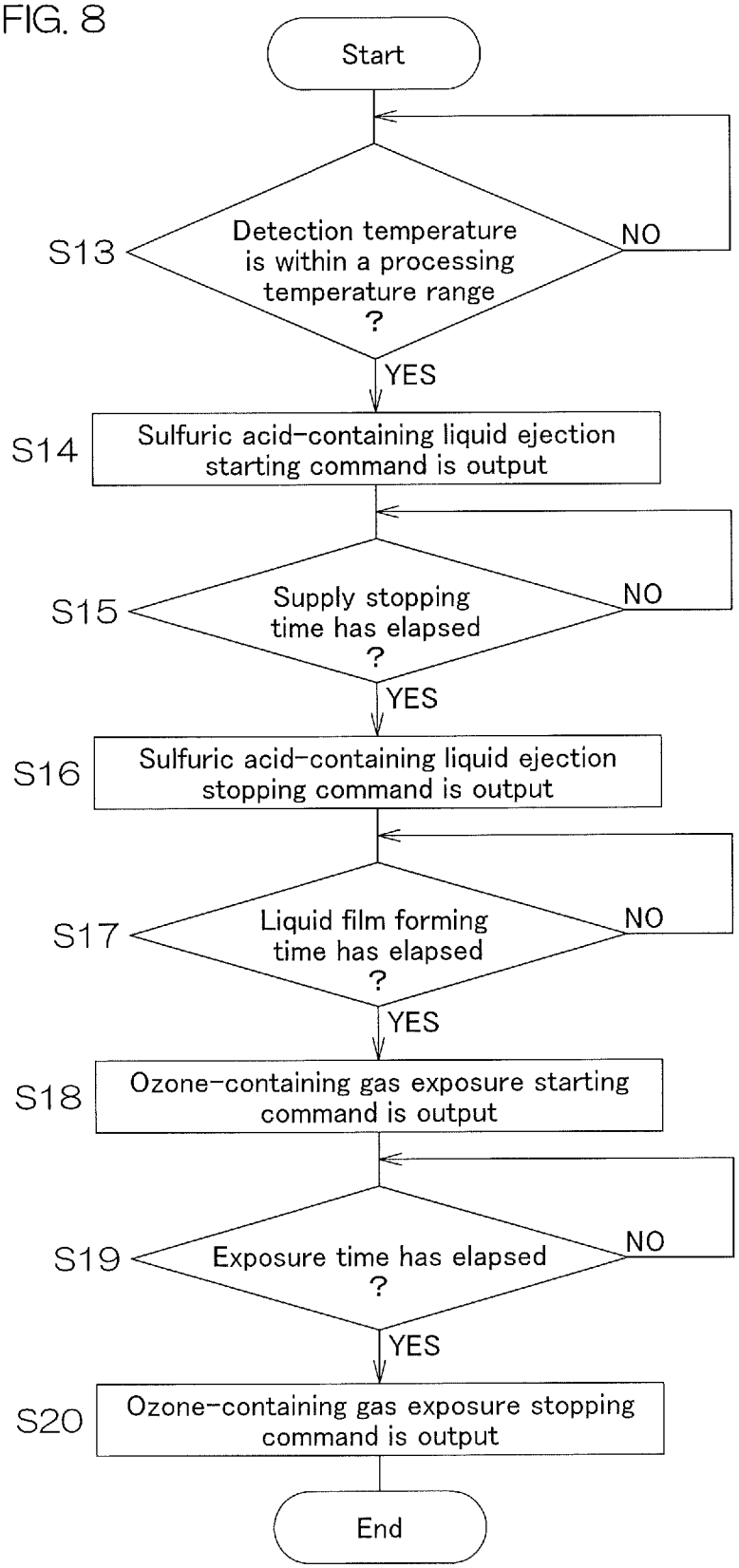
FIG. 8 is a flow chart for describing one example of removal processing of an organic film by the controller.

FIG. 7 is a block diagram for describing a functional configuration of the controller 3. FIG. 8 is a flow chart for describing one example of organic film removing processing by the controller 3.

The controller 3 executes programs stored in the memory 3c (refer to FIG. 4), thereby acting as various functional processing units. When the controller 3 executes the programs, a program stored in the auxiliary storage device 3e (refer to FIG. 4) is developed into the memory 3c.

Specifically, the controller 3 is configured and also programmed so as to function as a temperature judging unit 90, a first starting unit 91, a first elapsed time judging unit 92, a first stopping unit 93, a second elapsed time judging unit 94, a second starting unit 95, a third elapsed time judging unit 96, and a second stopping unit 97. The controller 3 functions as these processing units, thereby executing the organic film removing processing to remove the organic film from the upper surface of the substrate W.

The temperature judging unit 90 judges whether a detection temperature detected by the temperature sensor 62 is a temperature within the processing temperature range or not (Step S13). The processing temperature range is, for example, a range of not less than 50° C. and not more than 270° C. The processing temperature range is preferably in a range of not less than 50° C. and not more than 270° C. and more preferably in a range of not less than 80° C. and not more than 170° C. Where the detection temperature detected by the temperature sensor 62 is a temperature out of the range of processing starting temperatures (Step S13: NO), the temperature judging unit 90 returns to Step S13.

Where the temperature judging unit 90 judges that the detection temperature by the temperature sensor 62 has reached a temperature in the processing temperature range (Step S13: YES), the first starting unit 91 outputs a command to start ejection of the sulfuric acid-containing liquid to the first nozzle driving mechanism 25 and the sulfuric acid-containing liquid valve 50A (Step S14). Thereby, the first moving nozzle 9 is moved toward the processing position, and ejection of the sulfuric acid-containing liquid from the first moving nozzle 9 is also started. Therefore, it is possible to quickly heat the sulfuric acid-containing liquid supplied to the upper surface of the substrate W.

The command to start ejection of the sulfuric acid-containing liquid includes, for example, a processing position moving command which is output to the first nozzle driving mechanism 25 to move the first moving nozzle 9 and a first opening command which is output to the sulfuric acid-containing liquid valve 50A in a state that the first moving nozzle 9 is disposed at the processing position after the output of the first moving command, thereby opening the sulfuric acid-containing liquid valve 50A.

After the output of the command to start ejection of the sulfuric acid-containing liquid, that is, after the start of ejection of the sulfuric acid-containing liquid from the first moving nozzle 9, the first elapsed time judging unit 92 judges whether a supply stopping time has elapsed or not (Step S15). Where the supply stopping time has not elapsed (Step S15: NO), the first elapsed time judging unit 92 returns to Step S15.

Where the first elapsed time judging unit 92 judges that the supply stopping time has elapsed (Step S15: YES), the first stopping unit 93 outputs a command to stop ejection of the sulfuric acid-containing liquid to the first nozzle driving mechanism 25 and the sulfuric acid-containing liquid valve 50A (Step S16). Thereby, the ejection of the sulfuric acid-containing liquid from the first moving nozzle 9 is stopped and the first moving nozzle 9 is also moved toward the retreat position. Therefore, it is possible to control an ejection time of the sulfuric acid-containing liquid with high reproducibility. The supply stopping time is set in advance on the basis of a rotational speed of the substrate W and a supply flow rate of the sulfuric acid-containing liquid.

The command to stop ejection of the sulfuric acid-containing liquid includes, for example, a first closing command which is output to the sulfuric acid-containing liquid valve 50A to close the sulfuric acid-containing liquid valve 50A and a retreat position moving command which is output to the first nozzle driving mechanism 25 after the output of the first closing command to move the first moving nozzle 9.

After the output of the command to stop ejection of the sulfuric acid-containing liquid, that is, after stopping ejection of the sulfuric acid-containing liquid from the first moving nozzle 9, the second elapsed time judging unit 94 judges whether a liquid film forming time has elapsed or not (Step S17). The liquid film forming time is, for example, a time elapsed from a time point when ejection of the sulfuric acid-containing liquid from the first moving nozzle 9 is started. The liquid film forming time is a time longer than the ejection time. Where the liquid film forming time has not elapsed (Step S17: NO), the second elapsed time judging unit 94 returns to Step S17.

Where the second elapsed time judging unit 94 judges that the liquid film forming time has elapsed (Step S17: YES), the second starting unit 95 outputs an ozone-containing gas exposure starting command to the processing chamber driving mechanism 73 and the ozone-containing gas valve 55A (Step S18). Thereby, the processing chamber 12 is moved toward the housing position and ejection of the from the ozone-containing gas ozone-containing gas supplying member 13 is also started. Therefore, after formation of the liquid film 100 of the sulfuric acid-containing liquid, supply of the ozone-containing gas to the processing chamber 12 is quickly started. The second elapsed time judging unit 94 is an example of the elapsed time judging unit.

The ozone-containing gas exposure starting command includes, for example, a housing position moving command which is output to the processing chamber driving mechanism 73 to move the processing chamber 12 toward the housing position and as second opening command which is output to the ozone-containing gas valve 55A when the processing chamber 12 is disposed at the housing position after the output of the housing position moving command, thereby opening the ozone-containing gas valve 55A.

After the output of the ozone-containing gas exposure starting command, the third elapsed time judging unit 96 judges whether an exposure time has elapsed or not (Step S19). The exposure time is a time elapsed from a time point when ejection of the ozone-containing gas from the ozone-containing gas supplying member 13 is started. Where the exposure time has not elapsed (Step S19: NO), the third elapsed time judging unit 96 returns to Step S19.

Where the third elapsed time judging unit 96 judges that the exposure time has elapsed (Step S19: YES), the second stopping unit 97 outputs an ozone-containing gas exposure stopping command to the processing chamber driving mechanism 73 and the ozone-containing gas valve 55A (Step S20). Thereby, the processing chamber 12 is moved toward the non-housing position, and ejection of the ozone-containing gas from the ozone-containing gas supplying member 13 is stopped. Therefore, it is possible to dissolve an adequate amount of ozone into the liquid film 100 of the sulfuric acid-containing liquid and remove the organic film from the upper surface of the substrate W.

The ozone-containing gas exposure stopping command includes, for example, a second closing which is output to the ozone-containing gas valve 55A to close the ozone-containing gas valve 55A and a non-housing position moving command which is output to the processing chamber driving mechanism 73 after the output of the second closing command, to move the processing chamber 12 toward the non-housing position.

As described so far, the controller 3 functions as the above-described functional processing units, thus making it possible to process the substrate with high reproducibility. Therefore, it is possible to remove the organic film from the upper surface of the substrate W with high reproducibility.

<Summary of First Preferred Embodiment>

According to the first preferred embodiment of the present invention, the ozone-containing gas is filled inside the processing chamber 12 in a state that the substrate W is disposed inside the processing chamber 12 to expose the liquid film 100 of the sulfuric acid-containing liquid on the substrate W to the ozone-containing gas. Thereby, ozone in the ozone-containing gas can be dissolved into the sulfuric acid-containing liquid constituting the liquid film 100 on the substrate W to form peroxydisulfuric acid in the liquid film 100.

Further, in a state that the liquid film 100 is formed in the upper surface of the substrate W, the substrate W is heated. That is, in a state that peroxydisulfuric acid is formed in the sulfuric acid-containing liquid constituting the liquid film 100 on the upper surface of the substrate W, the substrate W is heated. Therefore, it is possible to increase an oxidizing power of peroxydisulfuric acid.

Still further, the substrate W is heated in a state that the ozone-containing gas is filled inside the processing chamber 12. Therefore, even if ozone is decreased in solubility to the sulfuric acid-containing liquid due to the heating, such a state can be kept that the ozone-containing gas which contains ozone at a sufficient concentration is in contact with the sulfuric acid-containing liquid on the upper surface of the substrate W. It is, therefore, possible to suppress gasification of ozone in the sulfuric acid-containing liquid.

As a result, the organic film such as a resist, etc., can be removed quickly and sufficiently from the substrate W.

According to the first preferred embodiment, the heating of the substrate W in the substrate heating step (Step S2) is started before the liquid film forming step (Step S3) and the ozone-containing gas exposing step (Step S4). Therefore, even where a time necessary for raising a temperature of the substrate W is longer than a time necessary for forming the liquid film 100 and a time necessary for filling the ozone-containing gas, the temperature of the substrate W can be timely brought into the processing temperature range.

According to the first preferred embodiment, the ozone-containing gas exposing step (Step S4) includes a pressure applying/supplying step which supplies the ozone-containing gas to the processing chamber 12 so that a pressure inside the processing chamber 12 becomes higher than a pressure outside the processing chamber 12 in a state that the liquid film 100 of the sulfuric acid-containing liquid is formed on the upper surface of the substrate W. Here, on the basis of Henry's law, the amount of a gas dissolved into a liquid is proportional to a pressure of the gas in contact with the liquid. Therefore, the ozone-containing gas is supplied into the processing chamber 12 to raise a pressure of the ozone-containing gas in contact with the sulfuric acid-containing liquid on the upper surface of the substrate W, thus making it possible to increase a concentration of ozone in the sulfuric acid-containing liquid. Thereby, peroxydisulfuric acid in the liquid film 100 can be increased in concentration, so that the organic film can be removed quickly and sufficiently from the upper surface of the substrate W.

According to the first preferred embodiment, after the substrate heating step (Step S2), the rinse liquid is supplied to the upper surface of the substrate W (rinse liquid supplying step). Therefore, the liquid film 100 of the sulfuric acid-containing liquid can be removed by the rinse liquid from the upper surface of the substrate W. Accordingly, it is possible to prevent sulfuric acid from remaining on the upper surface of the substrate W after the end of removal of the organic film from the upper surface of the substrate W.

According to the first preferred embodiment, in the liquid film forming step, the sulfuric acid-containing liquid is supplied toward the upper surface of the substrate W (sulfuric acid-containing liquid supplying step). After stopping supply of the sulfuric acid-containing liquid to the upper surface to the substrate W, the substrate W is rotated to thin the sulfuric acid-containing liquid on the upper surface of the substrate W, thereby forming the liquid film 100 (film thinning step).

Therefore, as compared with a case that the sulfuric acid-containing liquid is spread over the entire upper surface of the substrate W while a continuous flow of the sulfuric acid-containing liquid is supplied to the upper surface of the substrate W, it is possible to shorten a time to supply the sulfuric acid-containing liquid to the upper surface of the substrate W. As described above, the ejection period of time of the sulfuric acid-containing liquid is, for example, about one second. Therefore, the amount of use of the sulfuric acid-containing liquid used can be reduced.

Further, as compared with the case that the sulfuric acid-containing liquid is spread over the entire upper surface of the substrate W while a continuous flow of the sulfuric acid-containing liquid is supplied to the upper surface of the substrate W, it is possible to thin the liquid film 100 of the sulfuric acid-containing liquid on the upper surface of the substrate W. Therefore, it is possible to shorten a time necessary for heating the liquid film 100 and realize a reduction in power consumption.

Peroxydisulfuric generated by reaction of sulfuric acid with ozone dissolved in the sulfuric acid-containing liquid from the surface of the liquid film 100 diffuses in the liquid film 100 and reaches the upper surface of the substrate W, thereby reacting with the organic film on the upper surface of the substrate W. Therefore, the liquid film 100 is made thin, by which peroxydisulfuric acid can easily reach the upper surface of the substrate W. Accordingly, the organic film can be removed quickly and sufficiently from the upper surface of the substrate W.

According to the first preferred embodiment, in a state that the substrate W in which the liquid film 100 is formed is disposed inside the processing chamber 12, supply of the ozone-containing gas to the processing chamber 12 is started to fill the ozone-containing gas inside the processing chamber 12.

Unlike in the first preferred embodiment, where the liquid film 100 is formed after the supply of the ozone-containing gas to the processing chamber 12 is ended, ozone in an atmosphere inside the processing chamber 12 may be decreased in concentration due to the ozone-containing gas which flows out from the processing chamber 12. Therefore, ozone which is dissolved into the sulfuric acid-containing liquid in the liquid film 100 may be decreased in amount. Thus, in a state that the liquid film 100 has already been formed, supply of the ozone-containing gas is started, by which in a state that the concentration of ozone in an atmosphere inside the processing chamber 12 is sufficiently high, the liquid film 100 can be brought into contact with the atmosphere inside the processing chamber 12. Therefore, it is possible to increase the amount of ozone which is dissolved into the sulfuric acid-containing liquid in the liquid film 100 on the upper surface of the substrate W.

According to the first preferred embodiment, the spin chuck 8 and the processing chamber 12 are housed in the chamber 7. The processing chamber 12 moves with respect to the spin chuck 8 so that the substrate W relatively moves between the inside of the processing chamber 12 and the outside of the processing chamber 12. Therefore, the processing chamber 12 can be lowered inside the chamber 7 to house the substrate W inside the processing chamber 12 (substrate housing step), and the processing chamber 12 can be raised inside the chamber 7 to detach the substrate W from the processing chamber 12 (substrate detaching step).

Accordingly, in a state that the substrate W is disposed inside the processing chamber 12 which is raised and lowered inside the chamber 7, the ozone-containing gas can be supplied to the processing chamber 12 to fill the ozone-containing gas in the processing chamber 12. Therefore, as compared with a case that the ozone-containing gas is filled inside the chamber 7, it is possible to quickly fill the ozone-containing gas.

According to the first preferred embodiment, when the substrate W is positioned outside the processing chamber 12, the sulfuric acid-containing liquid is supplied from the first moving nozzle 9 to the upper surface of the substrate W to form the liquid film 100 on the upper surface of the substrate W and, thereafter, the substrate W can be disposed inside the processing chamber 12. Thereby, in a configuration that the first moving nozzle 9 is provided separately from the processing chamber 12, the ozone-containing gas can be quickly supplied to the liquid film 100 on the upper surface of the substrate W.

The liquid film 100 of the sulfuric acid-containing liquid has a thickness of (not less than 1 μm and not more than 2 mm) and is thin to such an extent that it can be quickly heated and the liquid film 100 can be raised in temperature due to heating by the quickly substrate heating member 14. Therefore, unlike in the configuration shown in FIG. 3, the sulfuric acid-containing liquid supplying unit 16 may not be provided with the tank heater 86 or the piping heater 85.

<Substrate Processing According to Modified Examples>

Figure 9A:
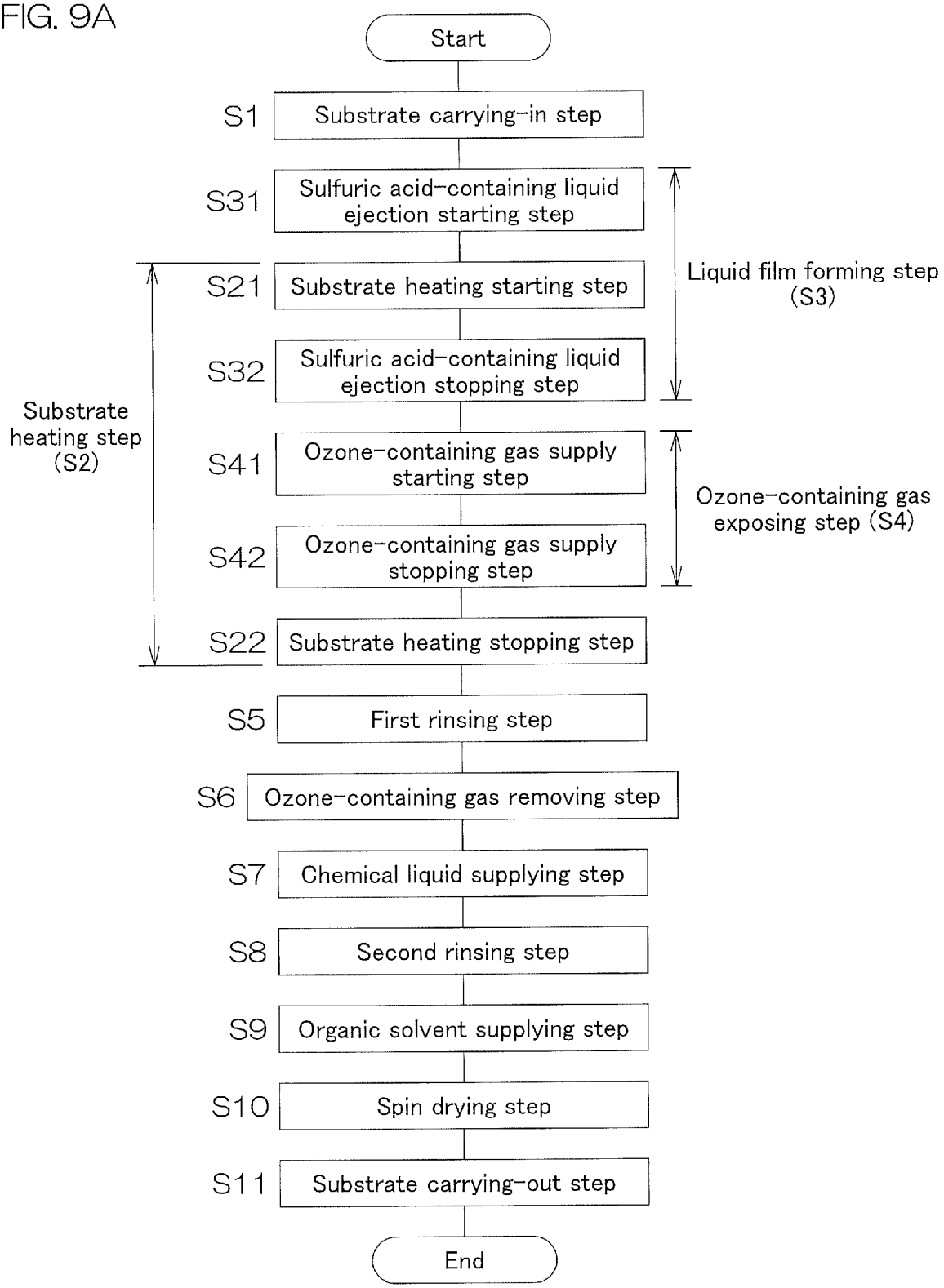
FIG. 9A is a flow chart for describing substrate processing according to a first modified example.
Figure 9B:
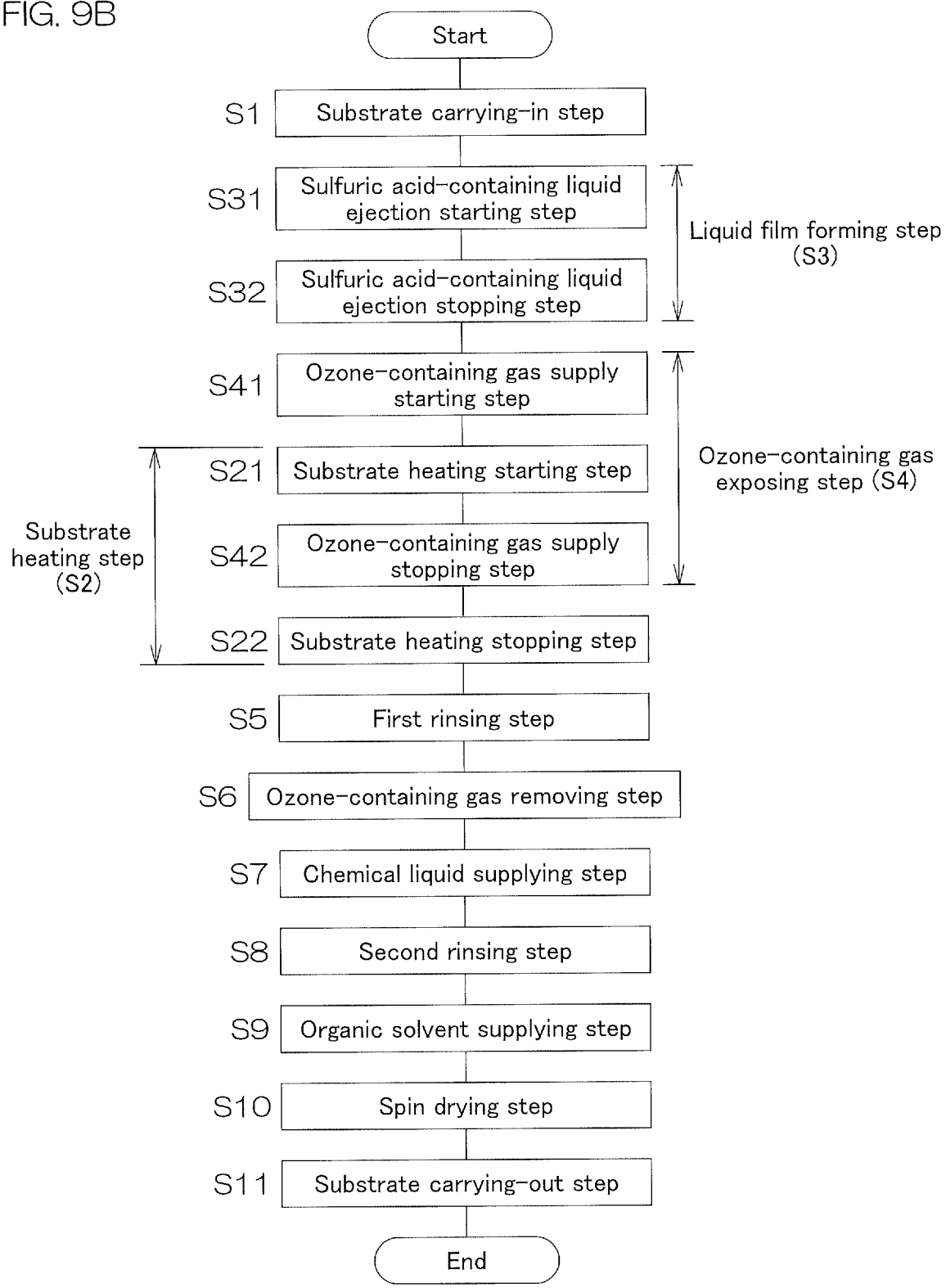
FIG. 9B is a flow chart for describing substrate processing according to a second modified example.
Figure 9C:
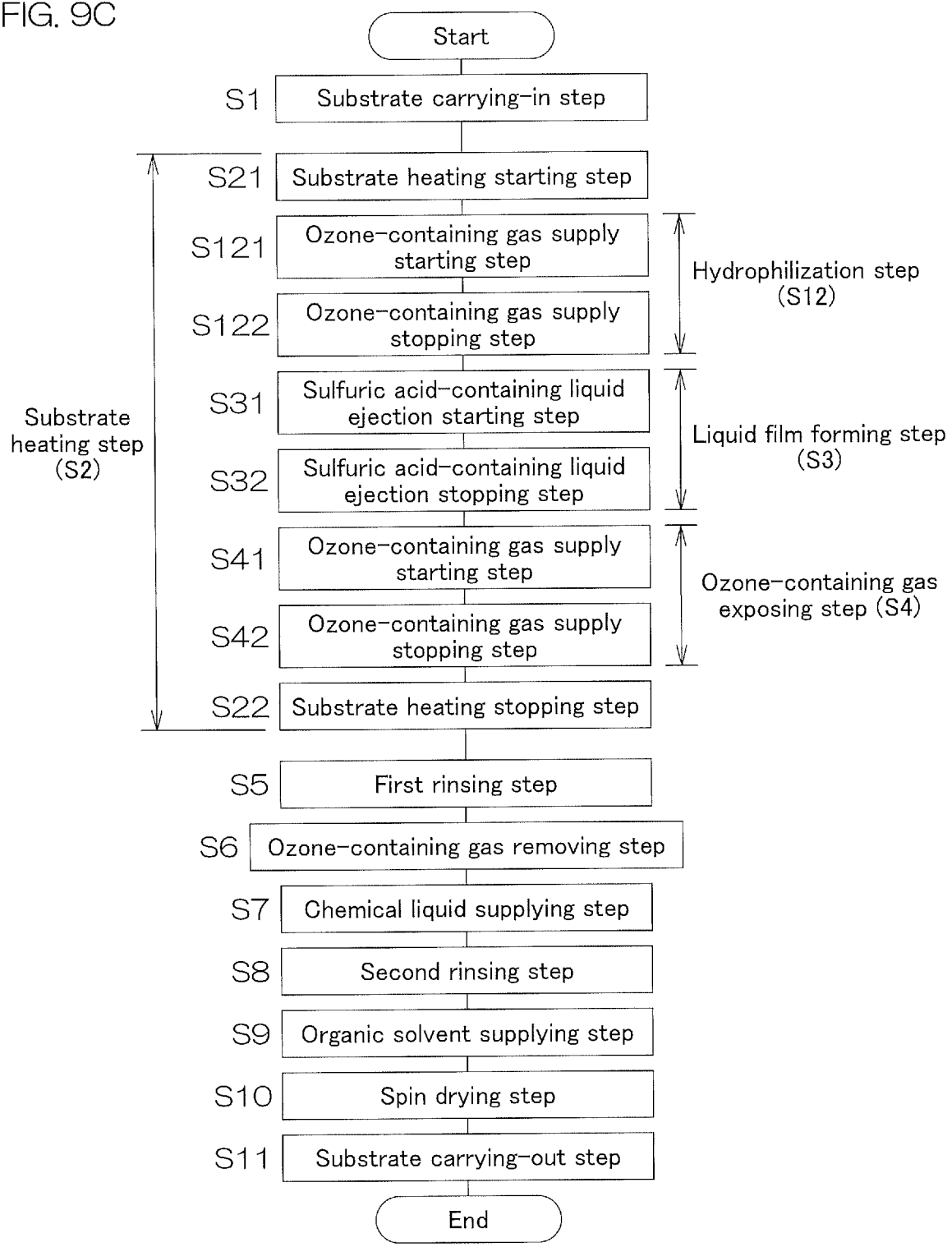
FIG. 9C is a flow chart for describing substrate processing according to a third modified example.

FIG. 9A to FIG. 9C are each a flow chart for describing substrate processing according to modified examples.

Substrate processing according to a first modified example shown in FIG. 9A is different from the substrate processing shown in FIG. 5 in that in the substrate processing according to the first modified example, a sulfuric acid-containing liquid ejection starting step (Step S31) is executed before a substrate heating starting step (Step S21). In detail, before a substrate heating member 14 reaches a proximity position, ejection of a sulfuric acid-containing liquid to an upper surface of a substrate W is started from a first moving nozzle 9.

Substrate processing according to a second modified example shown in FIG. 9B is different from the substrate processing shown in FIG. 5 in that after an ozone-containing gas supply starting step (Step S41), a substrate heating starting step (Step S21) is executed. In detail, before the substrate heating member 14 reaches a proximity position, a liquid film of the sulfuric acid-containing liquid is formed and supply of an ozone-containing gas to a processing chamber 12 is also started.

If the processing chamber 12 is disposed at a housing position, unlike in the substrate processing shown in FIG. 9B, before the substrate heating starting step (Step S21), an ozone-containing gas supply stopping step (Step S42) may be executed. In detail, before the substrate heating member 14 reaches the proximity position, supply of the ozone-containing gas to the processing chamber 12 may be stopped.

On the other hand, heating of the substrate W is not necessarily started in a state that the ozone-containing gas is filled inside the processing chamber 12 and a liquid film 100 is also formed on the upper surface of the substrate W. That is, as shown in the substrate processing of FIG. 5, in a state that the ozone-containing gas is filled inside the processing chamber 12 in which the substrate W is housed and the liquid film 100 is also formed on the upper surface of the substrate W, heating of the substrate W may be executed. In other words, irrespective of a timing which starts heating of the substrate W, if the substrate W is heated in a state that the ozone-containing gas is filled inside the processing chamber 12 in which the substrate W is housed and the liquid film 100 is also formed on the upper surface of the substrate W, an organic film can be quickly and sufficiently removed from the upper surface of the substrate W.

Substrate processing according to a third modified example shown in FIG. 9C is different from the substrate processing shown in FIG. 5 in that before the liquid film 100 of the sulfuric acid-containing liquid is formed on the upper surface of the substrate W, a hydrophilization step (Step S12) is executed in which the upper surface of the substrate W is hydrophilized.

Specifically, after heating of the substrate W by the substrate heating member 14 has been started, a processing chamber driving mechanism 73 moves the processing chamber 12 from a non-housing position toward the housing position. Then, an ozone-containing gas valve 55A is opened. Thereby, in a state that the substrate W is disposed inside the processing chamber 12, supply of the ozone-containing gas to the processing chamber 12 is started (ozone-containing gas supply starting step: Step S121). The ozone-containing gas is supplied into the processing chamber 12 to fill the ozone-containing gas inside the processing chamber 12 (ozone-containing gas supplying step, ozone-containing gas filling step). The ozone-containing gas is filled inside the processing chamber 12, by which the upper surface of the substrate W is exposed to the ozone-containing gas (substrate upper surface exposing step).

After the upper surface of the substrate W has been exposed to the ozone-containing gas for a predetermined period of time, the ozone-containing gas valve 55A is closed. Then, in a state that the ozone-containing gas valve 55A is closed, the processing chamber driving mechanism 73 moves the processing chamber 12 from the housing position toward the non-housing position. Thereby, the supply of the ozone-containing gas into the processing chamber 12 is stopped (ozone-containing gas supply stopping step: Step S122) and exposure of the ozone-containing gas to the upper surface of the substrate W is stopped.

In the substrate processing according to the third modified example, before the liquid film 100 of the sulfuric acid-containing liquid is formed on the upper surface of the substrate W, the upper surface of the substrate W is hydrophilized. In detail, the upper surface of the substrate W is oxidized by the ozone-containing gas, by which the upper surface of the substrate W is increased in hydrophilicity (ozone hydrophilization step). The upper surface of the substrate W is hydrophilized to improve wettability of the upper surface of the substrate W, and the sulfuric acid-containing liquid can be easily spread on the upper surface of the substrate W. Accordingly, it is possible to realize thinning of the liquid film 100 of the sulfuric acid-containing liquid. Furthermore, the liquid film 100 is made thin, by which ozone can easily reach the upper surface of the substrate W, and the organic film can be quickly and sufficiently removed from the upper surface of the substrate W.

In the substrate processing according to the third modified example, the ozone-containing gas can be supplied to hydrophilize the upper surface of the substrate W. Therefore, the ozone-containing gas can be used both in hydrophilization of the upper surface of the substrate W and removal of the organic film from the upper surface of the substrate W. Accordingly, as compared with a case that a method different from supply of the ozone-containing gas is used to hydrophilize the upper surface of the substrate W, it is possible to simplify equipment necessary for the substrate processing.

In the substrate processing according to the third modified example shown in FIG. 9C, after the substrate heating starting step (Step S21), the ozone-containing gas supply starting step (Step S121) is executed. Although not shown, unlike in the substrate processing according to the third modified example shown in FIG. 9C, the ozone hydrophilization starting step (Step S121) may be started before the substrate starting step (Step S21).

<Substrate Processing Apparatus According to Second Preferred Embodiment>

Figure 10:
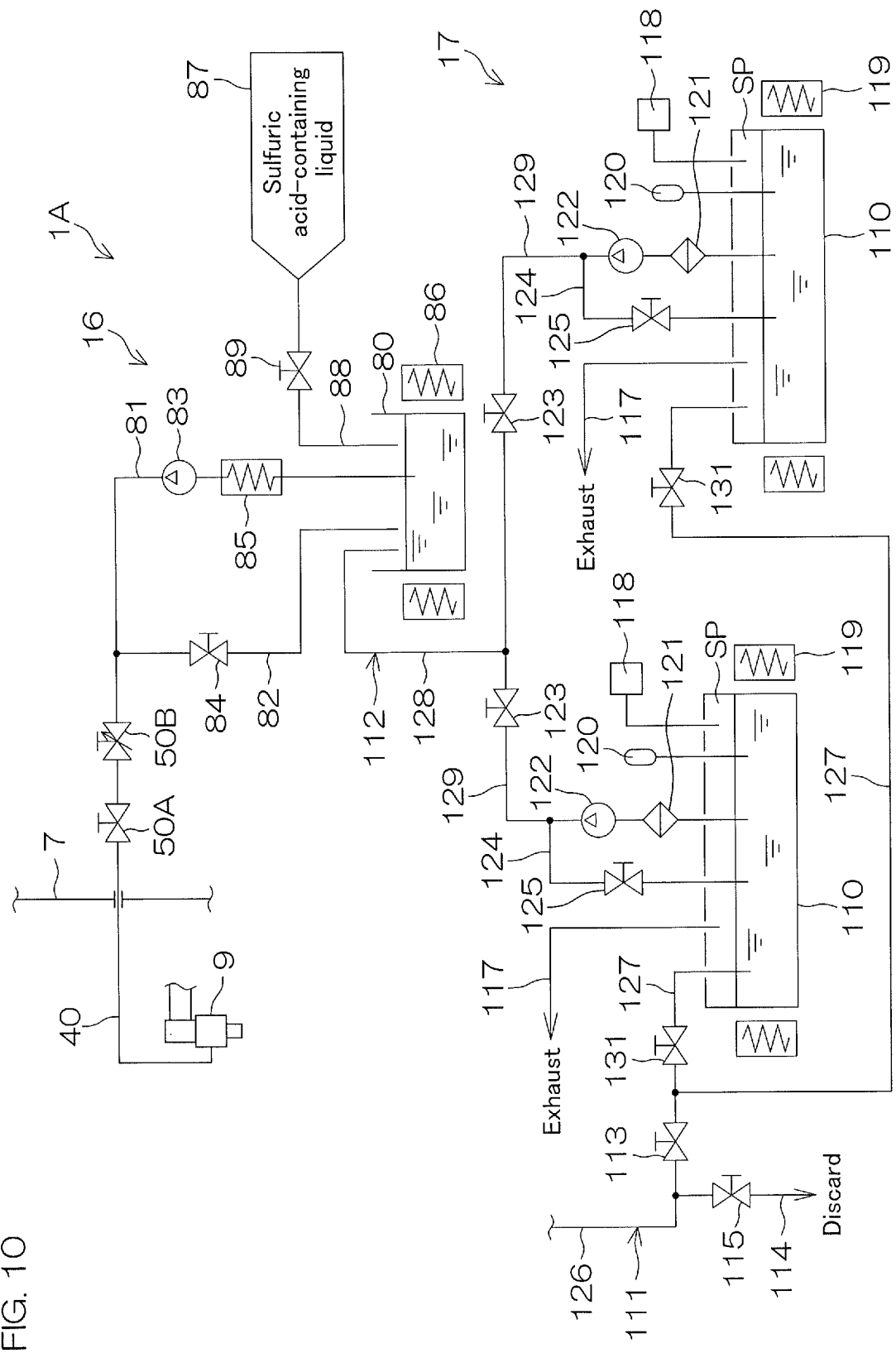
FIG. 10 is a schematic view for describing a configuration of a sulfuric acid-containing liquid supplying unit and a sulfuric acid-containing liquid recovering unit which are provided in a substrate processing apparatus according to a second preferred embodiment.

FIG. 10 is a schematic for describing a configuration of a sulfuric acid-containing liquid supplying unit 16 and a sulfuric acid-containing liquid recovering unit 17 which are provided in a substrate processing apparatus 1A according to the second preferred embodiment. In FIG. 10, configurations that are equivalent to the configurations shown in FIG. 1 to FIG. 9C described above are provided with the same reference symbols as in FIG. 1, etc., and descriptions thereof will be omitted. The substrate processing apparatus 1A of the second preferred embodiment is different from the substrate processing apparatus 1 according to the first preferred embodiment mainly in that the substrate processing apparatus 1A further includes the sulfuric acid-containing liquid recovering unit 17 which recovers a sulfuric acid-containing liquid discharged from an upper surface of a substrate W.

The sulfuric acid-containing liquid recovering unit 17 includes a plurality (two in the example shown in FIG. 10) of recovery tanks 110 which recover the sulfuric acid-containing liquid discharged from a processing unit 2, a recovery piping 111 which connects the processing unit 2 and the plurality of recovery tanks 110, and a liquid feeding piping 112 which feeds the sulfuric acid-containing liquid from the plurality of recovery tanks 110 to a storage tank 80.

The recovery tank 110 is a tank, an upper portion of which is closed, and an internal space SP of the recovery tank 110 is communicated with the outside via an exhaust piping 117. The recovery tank 110 has the internal space SP in contact with a liquid surface of the sulfuric acid-containing liquid inside the recovery tank 110. The exhaust piping 117 exhausts the internal space SP of the recovery tank 110.

The recovery piping 111 includes an upstream recovery piping 126 which is connected to a processing cup 15 of the processing unit 2 and a plurality of downstream recovery pipings 127 which are branched from the upstream recovery piping 126 and connected respectively to the plurality of recovery tanks 110.

The liquid feeding piping 112 includes a downstream liquid feeding piping 128 connected to the storage tank 80 and a plurality of upstream liquid feeding pipings 129 which are branched from the downstream liquid feeding piping 128 and connected respectively to the plurality of recovery tanks 110.

The sulfuric acid-containing liquid recovering unit 17 includes an upstream recovery valve 113 which is provided in the upstream recovery piping 126, a discard piping 114 which is connected to a further upstream side from the upstream recovery valve 113 in the upstream recovery piping 126 to discard the sulfuric acid-containing liquid inside the upstream recovery piping 126, and a discard valve 115 which is provided in the discard piping 114.

The sulfuric acid-containing liquid recovering unit 17 further includes a downstream recovery valve 131, an ozone densitometer 118, a recovery tank heater 119, a recovery temperature sensor 120, a liquid feeding filter 121, a liquid feeding pump 122, an upstream liquid feeding valve 123, a liquid feeding circulation piping 124 and a liquid feeding circulation valve 125. One each of these members is provided in each of the recovery tanks 110.

The downstream recovery valve 131 opens/closes the downstream recovery piping 127. The ozone densitometer 118 measures a concentration of ozone in the internal space SP of the recovery tank 110. The recovery tank heater 119 heats the sulfuric acid-containing liquid inside the recovery tank 110. The recovery temperature sensor 120 measures a temperature of the sulfuric acid-containing liquid inside the recovery tank 110.

The ozone densitometer 118 includes, for example, a meter main body and a gas supplying pipe which has a leading end positioned in the internal space SP of the recovery tank 110 and sends a gas in the internal space SP of the recovery tank 110 to the meter main body.

The recovery tank heater 119 is, for example, a heater which is attached to a wall portion of the recovery tank 110 from an outer surface thereof, as shown in FIG. 10. Unlike in FIG. 10, the recovery tank heater 119 may be attached to a lower surface of a bottom wall of the recovery tank 110 or may be attached to both of the bottom wall and a side wall. The recovery tank heater 119 may be a heater which is submerged into the sulfuric acid-containing liquid in the recovery tank 110.

The liquid feeding filter 121 removes impurities from the sulfuric acid-containing liquid which passes through the inside of the upstream liquid feeding piping 129. The liquid feeding pump 122 is provided at a further downstream side from the liquid feeding filter 121 in the upstream liquid feeding piping 129 and sends the sulfuric acid-containing liquid inside the upstream liquid feeding piping 129 toward the storage tank 80.

The upstream liquid feeding valve 123 is provided at a further downstream side from the liquid feeding pump 122 in the upstream liquid feeding piping 129 to open/close the upstream liquid feeding piping 129. The liquid feeding circulation piping 124 is connected to a further downstream side from the liquid feeding pump 122 and also a further upstream side from the upstream liquid feeding valve 123 in the upstream liquid feeding piping 129. The liquid feeding circulation valve 125 opens/closes the liquid feeding circulation piping 124.

According to the second preferred embodiment, the sulfuric acid-containing liquid which has been supplied from the first moving nozzle 9 to the upper surface of the substrate W can be recovered to reuse the sulfuric acid-containing liquid. Thereby, sulfuric acid to be discarded can be reduced in amount. The sulfuric acid-containing liquid recovered in the recovery tank 110 is heated to allow vaporization of ozone dissolved in the sulfuric acid-containing liquid. Ozone is vaporized and removed from the sulfuric acid-containing liquid, by which the sulfuric acid-containing liquid from which ozone has been sufficiently removed can be reused. Therefore, it is possible to suppress a change in concentration of ozone in the liquid film 100 of the sulfuric acid-containing liquid which is formed on the upper surface of the substrate W.

Further, since the plurality of recovery tanks 110 are provided, even where any of the recovery tanks 110 is not ready, the sulfuric acid-containing liquid can be supplied from another recovery tank 110 to the storage tank 80. The recovery tank 110 being not ready, which refers to a case that the sulfuric acid-containing liquid inside the recovery tank 110 is not sufficient in amount and a case that ozone is not sufficiently removed from the sulfuric acid-containing liquid inside the recovery tank 110.

<Substrate Processing Apparatus According to Third Preferred Embodiment>

Figure 11:
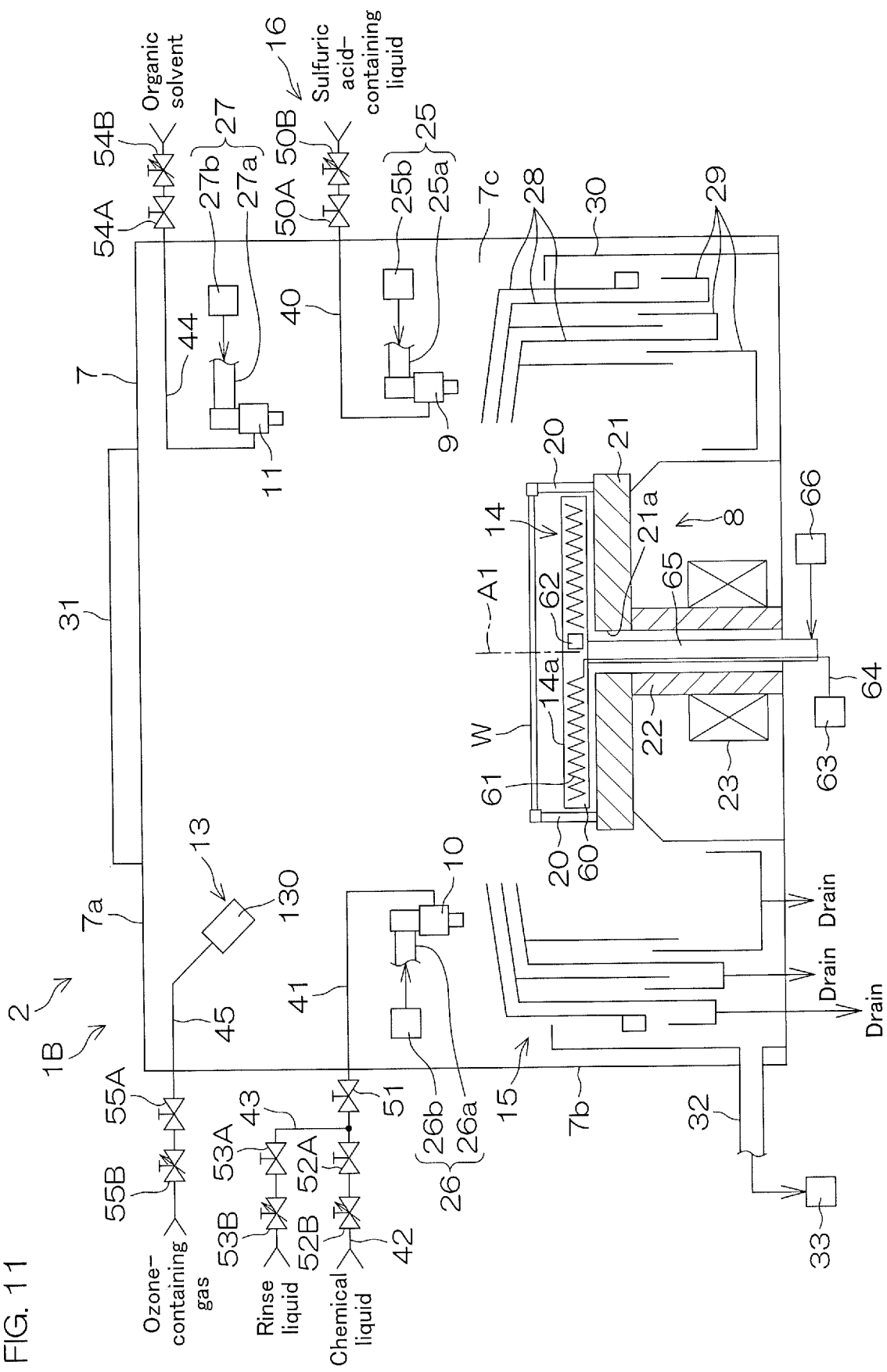
FIG. 11 is a schematic view for describing a configuration of a processing unit provided in a substrate processing apparatus according to a third preferred embodiment.

FIG. 11 is a schematic view for describing a configuration of a processing unit 2 provided in a substrate processing apparatus 1B according to the third preferred embodiment. In FIG. 11, configurations that are equivalent to the configurations shown in FIG. 1 to FIG. 10 described above are provided with the same reference symbols as in FIG. 1, etc., and descriptions thereof will be omitted. The same also applies to FIG. 12 which will be described later.

The processing unit 2 according to the third preferred embodiment is different from the processing unit 2 according to the first preferred embodiment mainly in that no processing chamber 12 is provided in the processing unit 2 according to the third preferred embodiment.

In detail, an ozone-containing gas supplying member 13 provided in the processing unit 2 according to the third preferred embodiment supplies an ozone-containing gas to an internal space 7c of a chamber 7. The ozone-containing gas supplying member 13 includes, for example, an ozone-containing gas ejecting nozzle 130 disposed inside the chamber 7. An ozone-containing gas piping 45 is connected to the ozone-containing gas ejecting nozzle 130. An ozone-containing gas valve 55A is opened, thus making it possible to start supply of the ozone-containing gas to the internal space 7c of the chamber 7.

In the third preferred embodiment, the chamber 7 functions as the processing chamber.

Unlike in FIG. 11, the ozone-containing gas supplying member 13 may have an ejecting port which is opened on a side wall 7b of the chamber 7. In the third preferred embodiment as well, the same substrate processing as the substrate processing (FIG. 5, FIG. 9A to FIG. 9C) according to the first preferred embodiment can be executed.

Figure 12:
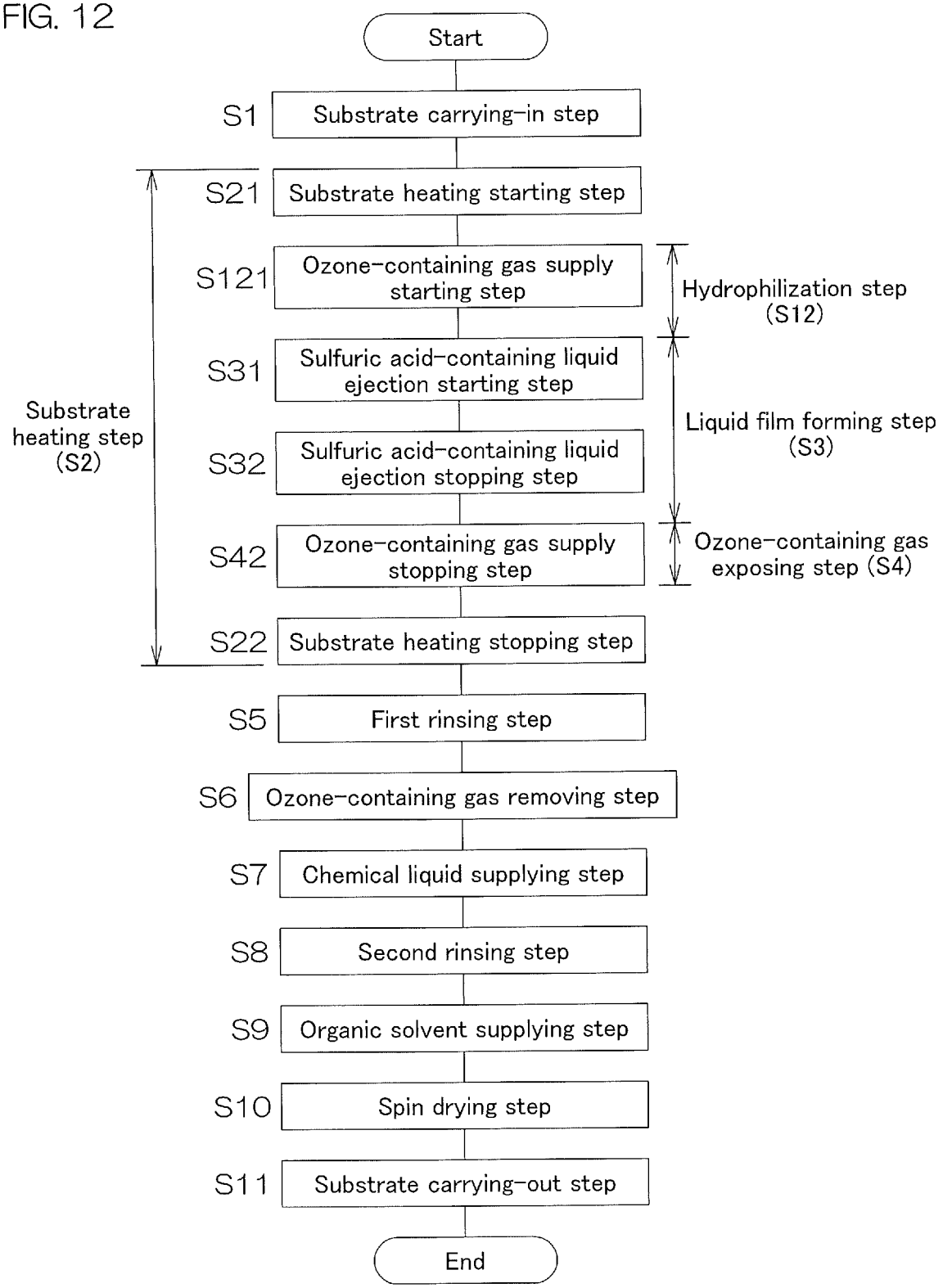
FIG. 12 is a flow chart for describing one example of substrate processing to be executed by the substrate processing apparatus according to the third preferred embodiment.

In the third preferred embodiment, the substrate processing shown in FIG. 12 can also be executed. FIG. 12 is a flow chart for describing one example of the substrate processing to be executed by the substrate processing apparatus 1B. In the substrate processing shown in FIG. 12, unlike in the substrate processing shown in FIG. 9C, supply of the ozone-containing gas to the processing chamber 12 is started before a liquid film forming step (Step S3) and stopped after the end of the liquid film forming step (Step S3), In detail, a current is supplied to a heater 61 by an energizing unit 63, and a temperature rise of the heater 61 is started. Then, a heater driving mechanism 66 moves a substrate heating member 14 from a retreat position to a proximity position. A temperature rise of the heater 61 is started and the substrate heating member 14 is disposed in the proximity position, by which heating of a substrate W is started (substrate heating starting step: Step S21). Thereby, a substrate heating step (Step S2) is executed.

Before ejection of a sulfuric acid-containing liquid to an upper surface of the substrate W is started, the ozone-containing gas valve 55A is opened. Thereby, the supply of the ozone-containing gas to the internal space 7c of the chamber 7 from the ozone-containing gas supplying member 13 is started (ozone-containing gas supply starting step: Step S121). The ozone-containing gas is continuously supplied to the internal space 7c of the chamber 7, thus making it possible to fill the ozone-containing gas inside the chamber 7 (ozone-containing gas supplying step, ozone-containing gas filling step).

The ozone-containing gas is filled inside the chamber 7, thereby exposing the upper surface of the substrate W held by a spin chuck 8 to the ozone-containing gas (upper surface of substrate exposing step). The upper surface of the substrate W is exposed to the ozone-containing gas, thereby hydrophilizing the upper surface of the substrate W (ozone hydrophilization step, hydrophilization step: Step S12).

Thereafter, the liquid film forming step (Step S3) is executed. The ozone-containing gas is supplied to the inside of the chamber 7 in a state that a liquid film 100 of the sulfuric acid-containing liquid is formed on the upper surface of the substrate W, thus making it possible to apply a pressure to the inside of the chamber 7 (pressure applying/supplying step).

After the liquid film forming step (Step S3), the ozone-containing gas valve 55A is closed. Thereby, the supply of the ozone-containing gas from the ozone-containing gas supplying member 13 to the internal space 7c of the chamber 7 is stopped (ozone-containing gas supply stopping step: Step S41). The ozone-containing gas is discharged via a discharge piping 32 from the internal space 7c of the chamber 7 in a state that supply of the ozone-containing gas is stopped, thus making it possible to stop the exposure of the ozone-containing gas to the upper surface of the substrate W.

Thereafter, the heater driving mechanism 66 moves the substrate heating member 14 from the proximity position to the retreat position. The substrate heating member 14 is disposed at the retreat position to stop the heating of the substrate W (substrate heating stopping step: Step S22). Thereby, the substrate heating step (Step S2) is ended.

Further thereafter, a first rinsing step (Step S5) to a substrate carrying-out step (Step S11) are executed sequentially.

As described above, the substrate processing apparatus 1B according to the third preferred embodiment can be used to allow supply of the ozone-containing gas to be started before ejection of the sulfuric acid-containing liquid. Accordingly, as compared with the substrate processing apparatus 1 according to the first preferred embodiment, various substrate processing can be executed. The substrate processing apparatus 1B according to the third preferred embodiment can provide the same effects as those of the substrate processing apparatus 1 according to the first preferred embodiment.

Where the substrate processing shown in FIG. 12 is executed, in the substrate processing in which supply of the ozone-containing gas is started before ejection of the sulfuric acid-containing liquid, the supply of the ozone-containing gas may be started on the basis of a detection temperature by a temperature sensor 62. In detail, where a temperature judging unit 90 judges that the detection temperature by the temperature sensor 62 has reached a temperature within a processing temperature range, a first starting unit 91 starts to supply the ozone-containing gas from the ozone-containing gas supplying member 13. Therefore, in a state that the substrate W has been heated at a sufficiently high temperature, supply of the ozone-containing gas from the ozone-containing gas supplying member 13 is started. Accordingly, it is possible to quickly start removal of an organic film from the upper surface of the substrate W.

<Other Preferred Embodiments>

The present invention is not limited to the aforementioned preferred embodiments and can be implemented in still other embodiments.

(1) In each of the aforementioned preferred embodiments, the processing liquids are arranged so as to be ejected from the plurality of moving nozzles. However, unlike in the aforementioned preferred embodiments, the processing liquids may be arranged so as to be ejected from fixed nozzles, the horizontal position of which is fixed, or the processing liquids may be arranged so as to be all ejected from a single nozzle.

For example, unlike in the first preferred embodiment, with no first moving nozzle 9 provided, the sulfuric acid-containing liquid supplying member may include a sulfuric acid-containing liquid nozzle which has an ejecting port exposed from the housing 71 of the processing chamber 12. In this case, the same substrate processing as that of the third preferred embodiment can be executed (refer to, for example, FIG. 12).

(2) In the aforementioned preferred embodiments, a continuous flow of the sulfuric acid-containing liquid is supplied to the upper surface of the substrate W to spread the sulfuric acid-containing liquid by a centrifugal force, thereby forming the liquid film 100. However, the sulfuric acid-containing liquid may be coated to form the liquid film 100 on the upper surface of the substrate W. In detail, a bar-shaped coating member having the sulfuric acid-containing liquid adhered to the surface thereof may be brought into contact with the upper surface of the substrate W while moving along the upper surface of the substrate W, thereby forming the liquid film 100. Alternatively, after a continuous flow of the sulfuric acid-containing liquid has been supplied to the upper surface of the substrate W, a bar-shaped coating member may be used to spread the liquid over the entire upper surface of the substrate W, thereby forming the liquid film 100.

(3) Examples of the substrate processing are shown in FIG. 5, FIG. 9A to FIG. 9C, and FIG. 12. However, the examples of the substrate processing are not limited to those described above. For example, after the end of supply of the ozone-containing gas to the processing chamber 12, the processing chamber 12 may be moved to the housing position, thereby exposing the liquid film 100 to the ozone-containing gas. Further, ejection of the sulfuric acid-containing liquid and supply of the ozone-containing gas may be started at the same time. Further, the substrate heating stopping step (Step S22) may be stopped during execution of the first rinsing step (Step S5). Still further, the chemical liquid supplying step (Step S7) to the organic solvent supplying step (Step S9) can be omitted, whenever appropriate.

Where ejection of the sulfuric acid-containing liquid and supply of the ozone-containing gas are started at the same time, the ejection of the sulfuric acid-containing liquid and supply of the ozone-containing gas may be both started on the basis of the detection temperature by the temperature sensor 62. In detail, where the temperature judging unit 90 judges that the detection temperature by the temperature sensor 62 has reached a temperature within the processing temperature range, the first starting unit 91 may start both supply of the ozone-containing gas and ejection of the sulfuric acid-containing liquid.

(4) Heating of the substrate W is not limited to heating by the substrate heating member 14. Specifically, the substrate heating member may include an infrared lamp which faces the upper surface of the substrate W or may include a heater which faces the upper surface of the substrate W. Alternatively, the substrate heating member may include a heating fluid nozzle which supplies a heating fluid such as a nitrogen gas, warm water, etc., to a lower surface of the substrate W. The substrate heating member may be arranged so as to heat the plate main body 60 by allowing the heating fluid to flow through the inside of the plate main body 60. Where the heating fluid is used, the substrate W is adjusted in temperature by adjusting an aperture of a valve which controls a flow rate of the heating fluid.

(5) The substrate processing apparatus 1 may be provided with a cooling plate (not shown) to cool the substrate W. The substrate W may be cooled to a room temperature by the cooling plate after the substrate heating stopping step (Step S22).

(6) In each of the aforementioned preferred embodiments, although the spin chuck 8 is a gripping type spin chuck which grips a peripheral edge of the substrate W by the plurality of gripping pins 20, the spin chuck 8 is not limited to the gripping type spin chuck. For example, the spin chuck 8 may be a vacuum suction type spin chuck which suctions the substrate W to the spin base 21.

(7) A configuration of the processing chamber 12 is not limited to that shown in FIG. 2. For example, an opening/closing processing chamber may be provided inside the chamber 7.

Further, the spin base 21 may be arranged so as to be raised and lowered. Accordingly, the substrate housing step may be a step in which the substrate W is raised (moved) inside the chamber 7 to house the substrate W in the processing chamber 12, or the substrate detaching step may be a step in which the substrate W is lowered (moved) inside the chamber 7 to detach the substrate W from the processing chamber 12. In brief, the substrate housing step may be a step in which the processing chamber 12 is moved relatively with respect to the substrate W inside the chamber 7 to house the substrate W in the processing chamber 12. Similarly, the substrate detaching step may be a step in which the processing chamber 12 is moved relatively with respect to the substrate W inside the chamber 7 to detach the substrate W from the processing chamber 12.

(8) The upper surface of the substrate W may be hydrophilized according to a method other than oxidation by the ozone-containing gas. For example, the upper surface of the substrate W may be hydrophilized by irradiating the upper surface with ultraviolet rays.

(9) In each of the aforementioned preferred embodiments, the controller 3 controls the substrate processing apparatus 1 in its entirety. However, controllers for controlling respective members of the substrate processing apparatus 1 may be provided separately at a plurality of sites. Further, the controller 3 is not required to control each member directly but a signal output from the controller 3 may be received by a slave controller which controls each member of the substrate processing apparatus 1.

(10) Further, in the aforementioned preferred embodiments, the substrate processing apparatus 1, 1A, 1B is provided with the transfer robots (first transfer robot IR and second transfer robot CR), the plurality of processing units 2, and the controller 3. However, the substrate processing apparatus 1, 1A, 1B may be constituted of a single processing unit 2 and a controller 3, and may not include a transfer robot. Alternatively, the substrate processing apparatus 1, 1A, 1B may be constituted only of a single processing unit 2. In other words, the processing unit 2 may be an example of the substrate processing apparatus.

(11) In the aforementioned preferred embodiments, expressions such as "along," "horizontally," "vertically," and "cylindrical shape" are used. However, each of the expressions is not required to be in a strict sense "along," "horizontally," "vertically," or "cylindrical shape." That is, each of the expressions allows for deviations in the accuracy of manufacturing, installation accuracy, etc.

(12) There is also a case that each of the configurations is schematically illustrated by using a block. However, a shape, a size, and a positional relationship of each block do not indicate the shape, the size, or the positional relationship of each of the configurations.

While preferred embodiments of the present invention have been described in detail, these are merely specific examples used to clarify the technical content of the present invention, and the present invention should not be interpreted as being limited to these specific examples and the scope of the present invention shall be limited only by the attached claims.

What is claimed is:

1. A substrate processing method comprising:
carrying-in a substrate into a processing chamber capable of housing the substrate, the substrate having a principal surface on which an organic film is formed,
forming a liquid film of a sulfuric acid-containing liquid on the principal surface of the substrate;
ozone-containing gas exposing including filling an ozone-containing gas inside the processing chamber so as to expose the liquid film to the ozone-containing gas such that ozone in the ozone-containing gas is dissolved into the sulfuric acid-containing liquid constituting the liquid film on the principal surface of the substrate to form peroxydisulfuric acid in the liquid film, and
substrate heating to heat the substrate in a state that the substrate is disposed inside the processing chamber which is filled with the ozone-containing gas, so that the liquid film is formed on the principal surface of the substrate, and so that the peroxydisulfuric acid is formed in the liquid film.

2. The substrate processing method according to claim 1, wherein the substrate heating is started before the liquid film forming and before the ozone-containing gas exposing.

3. The substrate processing method according to claim 1, wherein the ozone-containing gas exposing includes a pressure applying/supplying to supply the ozone-containing gas to the processing chamber so that a pressure inside the processing chamber is made higher than a pressure outside the processing chamber.

4. The substrate processing method according to claim 1, further comprising a rinse liquid supplying to supply a rinse liquid to the principal surface of the substrate after the substrate heating.

5. The substrate processing method according to claim 1, wherein the liquid film forming includes a sulfuric acid-containing liquid supplying to supply the sulfuric acid-containing liquid toward the principal surface of the substrate, and a film thinning, after the supply of the sulfuric acid-containing liquid to the principal surface of the substrate is stopped, to rotate the substrate around a central axis which passes through a central portion of the substrate so as to thin the sulfuric acid-containing liquid on the principal surface of the substrate, thereby forming the liquid film.

6. The substrate processing method according to claim 1, wherein the ozone-containing gas exposing includes starting supply of the ozone-containing gas to the processing chamber in a state that the substrate having the liquid film formed on the principal surface thereof is disposed in the processing chamber, thereby filling the ozone-containing gas inside the processing chamber.

7. The substrate processing method according to claim 1, further comprising a hydrophilization to hydrophilize the principal surface of the substrate before the formation of the liquid film in the liquid film forming is started.

8. The substrate processing method according to claim 7, wherein the hydrophilization includes an ozone hydrophilization, before the formation of the liquid film in the liquid film forming is started, to supply the ozone-containing gas to the processing chamber in a state that the substrate is disposed in the processing chamber, thereby exposing the principal surface of the substrate to the ozone-containing gas.

9. The substrate processing method according to claim 1, further comprising a substrate holding to cause a substrate holder disposed inside a chamber to hold the substrate, wherein
the ozone-containing gas exposing includes a substrate housing to move the processing chamber relatively with respect to the substrate held by the substrate holder inside the chamber so as to house the substrate held by the substrate holder inside the processing chamber, an ozone-containing gas supplying to supply the ozone-containing gas to the processing chamber in a state that the substrate is housed in the processing chamber, and a substrate detaching, after the ozone-containing gas supplying, to move the processing chamber relatively with respect to the substrate held by the substrate holder inside the chamber so as to detach the substrate held by the substrate holder from the processing chamber.

* * * * *